United States Patent
Paraschis et al.

(10) Patent No.: US 10,542,336 B2
(45) Date of Patent: Jan. 21, 2020

(54) MULTI-LAYER MECHANISMS TO OPTIMIZE OPTICAL TRANSPORT NETWORK MARGIN ALLOCATION

(71) Applicant: Infinera Corporation, Sunnyvale, CA (US)

(72) Inventors: Loukas Paraschis, Sunnyvale, CA (US); Harshad Sardesai, Sunnyvale, CA (US); Abhinava Shivakumar Sadasivarao, Sunnyvale, CA (US); Parthiban Kandappan, Sunnyvale, CA (US); Marco Sosa, Sunnyvale, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/917,386

(22) Filed: Mar. 9, 2018

(65) Prior Publication Data
US 2018/0220210 A1    Aug. 2, 2018

Related U.S. Application Data

(63) Continuation-in-part of application No. 15/639,947, filed on Jun. 30, 2017.

(Continued)

(51) Int. Cl.
| | | |
|---|---|---|
| H04B 10/08 | (2006.01) | |
| H04Q 11/00 | (2006.01) | |
| H03M 13/03 | (2006.01) | |

(52) U.S. Cl.
CPC ..... *H04Q 11/0066* (2013.01); *H04Q 11/0071* (2013.01); *H03M 13/03* (2013.01);
(Continued)

(58) Field of Classification Search
CPC .......... H04Q 11/0066; H04Q 11/0071; H04Q 2011/0075; H04Q 2011/0077;
(Continued)

(56) References Cited

U.S. PATENT DOCUMENTS

| | | | | |
|---|---|---|---|---|
| 8,433,192 B2* | 4/2013 | Frankel | ............. | H04B 10/0795 398/16 |
| 9,438,369 B2* | 9/2016 | Swinkels | ............ | H04J 14/0257 |

(Continued)

*Primary Examiner* — Mohammad R Sedighian
(74) *Attorney, Agent, or Firm* — David L. Soltz

(57) ABSTRACT

A method and apparatus for optimizing optical transport using a software defined network (SDN) controller are disclosed herein. The SDN controller may define a margin optimization function based on at least one optical system performance metric. The function may include at least one related initiation criterion. Further, the SDN controller may collect at least one measurement for the performance metric. The measurement may include an assessment of deployed carriers not carrying client data. The SDN controller may determine whether the initiation criterion is met based on at least one collected measurement. The SDN controller may select a system margin optimization mechanism and define a system margin optimization threshold criterion on a condition that the initiation criterion is met. The SDN controller may determine whether the optimization threshold criterion is met. The SDN controller may implement one or more optimization events on a condition that the optimization threshold criterion is met.

16 Claims, 19 Drawing Sheets

| Pro-active Re-route Mechanism-Workflow ||||
|---|---|---|---|
| Time | Monitoring Points | Description/Action | Link Capacity (Spectrum Occupancy) |
| $t=t_0$ | • Q+Factor$_{i+1..N}$ for every $\lambda_{i=1..N}$ between $O_5 \Leftrightarrow O_6$ WDM link (which carries end-to-end traffic $R_1$ and $R_2$)<br>• Optical amplifier output power of all the amplifiers between $\{O_5 \Leftrightarrow O_6\}$, $\{O_7 \Leftrightarrow O_8\}$ & $\{O_9 \Leftrightarrow O_{10}\}$ WDM links $(P_{out}{}_{i=1..M})$<br>• Round trip delay (RTD) per LSP over the WDM links, specifically for $\lambda_{i=1...3}$<br><br>(Configuring of the $T_{pp}$)<br>(Constant monitoring of there values)<br>(Optionally, can also be done at this stage → Configuring of $T_p$) | This is the "steady state" starting point.<br><br>The end-to-end traffic between $R_1$ and $R_2$ is going over the WDM links.<br><br>Specifically, 80 carriers in the $O_5 \Leftrightarrow O_6$(which can accommodate up to 125 carriers in this fiber span), and 50 carriers in the $O_7 \Leftrightarrow O_8$ (which again can accommodate up to 125 carriers in this fiber span). | Optical link (SRLG): $O_5 \Leftrightarrow O_6$(80/125 carriers in use)<br><br>Optical link (SRLG): $O_7 \Leftrightarrow O_8$(50/125 carriers in use)<br><br>Optical link (SRLG): $O_9 \Leftrightarrow O_{10}$(10/125 carriers in use) |

310

Related U.S. Application Data

(60) Provisional application No. 62/472,597, filed on Mar. 17, 2017, provisional application No. 62/453,553, filed on Feb. 2, 2017, provisional application No. 62/592,155, filed on Nov. 29, 2017.

(52) U.S. Cl.
CPC ............... *H04Q 2011/0075* (2013.01); *H04Q 2011/0077* (2013.01); *H04Q 2011/0088* (2013.01)

(58) Field of Classification Search
CPC ....... H04Q 2011/0088; H04Q 11/0062; H04Q 2011/0081; H03M 13/03; H04B 10/0793; H04J 14/0271; H04J 14/0284
USPC .......................................................... 398/25
See application file for complete search history.

(56) References Cited

U.S. PATENT DOCUMENTS

| | | | | |
|---|---|---|---|---|
| 9,509,434 B2* | 11/2016 | Swinkels | ............ | H04J 14/0227 |
| 10,148,384 B2* | 12/2018 | Swinkels | ............ | H04J 14/0227 |
| 2016/0050470 A1* | 2/2016 | Swinkels | ........... | H04Q 11/0062 |
| | | | | 398/45 |
| 2016/0182329 A1* | 6/2016 | Armolavicius | ......... | H04L 45/02 |
| | | | | 370/230 |

\* cited by examiner

| | | Pro-active Re-route Mechanism-Workflow | |
|---|---|---|---|
| t | Time | Monitoring Points | Description/Action | Link Capacity (Spectrum Occupancy) |
| ↓ | $t=t_0$ | • Q+Factor$_{i=1...N}$ for every $\lambda_{i=1...N}$ between $O_5 \Leftrightarrow O_6$ WDM link (which carries end-to-end traffic $R_1$ and $R_2$)<br>• Optical amplifier output power of all the amplifiers between $\{O_5 \Leftrightarrow O_6\}$, $\{O_7 \Leftrightarrow O_8\}$ & $\{O_9 \Leftrightarrow O_{10}\}$ WDM links ($p_{out}^{i=1...M}$)<br>• Round trip delay (RTD) per LSP over the WDM links, specifically for $\lambda_{i=1...3}$<br><br>(Configuring of the $T_{pp}$) (Constant monitoring of there values) (Optionally, can also be done at this stage → Configuring of $T_p$) | This is the "steady state" starting point.<br><br>The end-to-end traffic between $R_1$ and $R_2$ is going over the WDM links.<br><br>Specifically, 80 carriers in the $O_5 \Leftrightarrow O_6$ (which can accommodate up to 125 carriers in this fiber span), and 50 carriers in the $O_7 \Leftrightarrow O_8$ (which again can accommodate up to 125 carriers in this fiber span). | Optical link (SRLG):<br>$O_5 \Leftrightarrow O_6$ (80/125 carriers in use)<br><br>Optical link (SRLG):<br>$O_7 \Leftrightarrow O_8$ (50/125 carriers in use)<br><br>Optical link (SRLG):<br>$O_9 \Leftrightarrow O_{10}$ (10/125 carriers in use) |

FIG. 3A

| Pro-active Re-route Mechanism-Workflow ||||
|---|---|---|
| Time | Monitoring Points | Description/Action | Link Capacity (Spectrum Occupancy) |
| $t_1 = t_0 + n_1$ | • $T_{PP}$ criterion satisfied (Satisfying $T_{PP}$ criterion - F(X,Z)) (Choosing the right protection mechanism-A v/s B) | As the Q-Factor (measured) values exceeds 'α' the SDN Controller computer alternate paths for there carriers. The following are the options: A. Switch these to optical path $R1 \Leftrightarrow O1 \Leftrightarrow O5 \Leftrightarrow \underline{O7} \Leftrightarrow \underline{O8} \Leftrightarrow O6 \Leftrightarrow O3 \Leftrightarrow R2$ X • But the end-to-end RTD exceeds the required SLA of '$\delta_i$' for carriers $\lambda_{i=1..8}$ B. Trigger L3 restoration/ protection ✓ • Results in Router R1 finding an alternate L3 path (over WDM); $R_1 \Leftrightarrow R_3 \Leftrightarrow \underline{O_9} \Leftrightarrow \underline{O_{10}} \Leftrightarrow \underline{R_4} \Leftrightarrow R_2$ -meeting RTD requirements | Optical link (SRLG): $O_5 \Leftrightarrow O_6$ (80/125 carriers in use) Optical link (SRLG): $O_7 \Leftrightarrow O_8$ (50/125 carriers in use) Optical link (SRLG): $O_9 \Leftrightarrow O_{10}$ (10/125 carriers in use) |

FIG. 3B

| Pro-active Re-route Mechanism-Workflow ||||
|---|---|---|---|
| Time | Monitoring Points | Description/Action | Link Capacity (Spectrum Occupancy) |
| $t_2=t_1+n_2$ | • Protection event happens (based on $T_{PP}$ criterion)<br>• (Implementing the appropriate protection switching mechanism- due to $T_{PP}$)<br>• (If required/desired, determine and configure a $T_P$ criterion -If it hasn't already been specified earlier) | The SDN Controller triggers L3 restoration/protection for carriers $\lambda_{i=1..8}$<br>Results in Router R1 finding an alternate L3 path (over WDM):<br>$R_1 \Leftrightarrow \underline{R_3} \Leftrightarrow \underline{O_9} \Leftrightarrow \underline{O_{10}} \Leftrightarrow \underline{R_4} \Leftrightarrow R_2$ | Optical link (SRLG):<br>$O_5 \Leftrightarrow O_6$ (~~80~~ 72/125 carriers in use)<br>Optical link (SRLG):<br>$O_7 \Leftrightarrow O_8$ (50/125 carriers in use)<br>Optical link (SRLG):<br>$O_9 \Leftrightarrow O_{10}$ (~~10~~ 18/125 carriers in use) |

| Pro-active Re-route Mechanism-Workflow ||||
|---|---|---|---|
| Time | Monitoring Points | Description/Action | Link Capacity (Spectrum Occupancy) |
| $t_3 = t_2 + n_3$ | • $T_P$ Criterion satisfied<br>• Because the measured Raman pump optical amplifier output power of all the amplifier between ($O_5 \Leftrightarrow O_6$) WDM link ($P_{out}^{l=1..M}$) approaches $T_{PP}$ threshold 'Y' dBm<br>(Satisfying $T_P$ criterion - F(Z)) | As the measured Raman amplifier output power approached 'ß' dBm on {$O_5 \Leftrightarrow O_6$} WDM link, all the 72 carriers ($\lambda_{l=9..80}$) on this link face the prospect of disruption.<br>However, there carriers *do not* have the same latency SLA requirements (acceptable to have higher RTD) | Optical link (SRLG):<br>$O_5 \Leftrightarrow O_6$(72/125 carriers in use)<br><br>Optical link (SRLG):<br>$O_7 \Leftrightarrow O_8$(72/125 carriers in use)<br><br>Optical link (SRLG):<br>$O_9 \Leftrightarrow O_{10}$(18/125 carriers in use) |

| Time | Pro-active Re-route Mechanism-Workflow ||| 
|---|---|---|---|
| | Monitoring Points | Description/Action | Link Capacity (Spectrum Occupancy) |
| $t_4=t_3+n_4$ | • Protection event happens (based on $T_P$ criterion)<br><br>(Implementing the appropriate protection switching mechanism-due to $T_P$) | The SDN Controller computer alternate pathsfor there carriers, resulting in the following path:<br>R1⇔O1⇔O5⇔O7⇔O8⇔O6⇔O3⇔R2 ✓ | Optical link (SRLG):<br>$O_5$⇔$O_6$(0/125 carriers in use)<br><br>Optical link (SRLG):<br>$O_7$⇔$O_8$(122/125 carriers in use)<br><br>Optical link (SRLG):<br>$O_9$⇔$O_{10}$(18/125 carriers in use) |

Pro-active Re-route Mechanism-Workflow

| Time | Monitoring Points | Description/Action | Link Capacity (Spectrum Occupancy) |
|---|---|---|---|
| $t_5 = t_4 + n_4$ | New steady state | The state of the network after the SDN Controller performs pro-active L0+L3 protection | Optical link (SRLG): $O_5 \leftrightarrow O_6$ (0/125 carriers in use) <br><br> Optical link (SRLG): $O_7 \leftrightarrow O_8$ (122/125 carriers in use) <br><br> Optical link (SRLG): $O_9 \leftrightarrow O_{10}$ (18/125 carriers in use) |

MULTI-LAYER MECHANISMS TO OPTIMIZE OPTICAL TRANSPORT NETWORK MARGIN ALLOCATION

CROSS REFERENCE TO RELATED APPLICATIONS

This application claims the benefit of U.S. Provisional Application No. 62/592,155 filed Nov. 29, 2017, and is a continuation-in-part of U.S. patent application Ser. No. 15/639,947 filed Jun. 30, 2017, which claims the benefit of U.S. Provisional Application No. 62/453,553 filed Feb. 2, 2017 and U.S. Provisional Application No. 62/472,597 filed Mar. 17, 2017, the contents of which are incorporated by reference as if fully set forth herein.

FIELD OF INVENTION

The disclosed embodiments are generally directed to optical transport network optimization. Specifically, the disclosed embodiments are directed to the optimization of optical transport network wavelength division multiplexing (WDM) system margin allocation.

BACKGROUND

Network operators have long attempted to optimize the margin required on optical transport networks using planning tools. Such planning tools are typically employed before a network is deployed. In this way, network operators attempted to use optimization mechanisms on their networks before the actual performance of the network is known. After deployment, client data would then immediately be sent over the network which had been designed through such optimization methods. As a result, network optimization has been typically performed using planning tools and before the deployment of carriers to the network.

Internet Protocol (IP), such as IP over Ethernet, based packet transport over wavelength division multiplexing (WDM) systems has become the standard, and widely deployed, network architecture. Accordingly, this architecture includes at least an IP layer and a WDM layer and is typically referred to as a packet-optical transport architecture. Further, this architecture may include additional intermediate layers, such as a multi-protocol label switching (MPLS) layer and an Optical Transport Network (OTN) layer between the higher IP layer and the lower WDM layer.

Also, in currently operating packet-optical networks, protection is performed predominantly at a packet layer, which may be the IP layer or, typically, a combination of the IP layer and the MPLS layer. Such layers can be acceptable for the requirements of packet-optical network protection mechanisms, which typically require responses of no more than a few tens of milliseconds.

SUMMARY

A method and apparatus for optimizing optical transport using a software defined network (SDN) controller are disclosed herein. The SDN controller may define a margin optimization function based on at least one optical system performance metric. The margin optimization function may include at least one related initiation criterion. Further, the SDN controller may collect at least one measurement for the at least one optical system performance metric. The measurement may include an assessment of deployed carriers not carrying client data. The SDN controller may then determine whether the initiation criterion is met based on the at least one collected measurement. Further, the SDN controller may select a system margin optimization mechanism and define a system margin optimization threshold criterion on a condition that the initiation criterion is met. The SDN controller may determine whether the system margin optimization threshold criterion is met. The SDN controller may implement one or more optimization events on a condition that the system margin optimization threshold criterion is met.

Also, the SDN controller may implement the one or more optimization events on a condition that the system margin optimization threshold criterion is met within a time period. Further, at least one of the optimization events may include minimizing an available optical system margin. In addition, the SDN controller may further collect at least one measurement for an optical system performance metric on a condition that the system margin optimization threshold criterion is not met within a time period.

In an example, the system margin optimization mechanism may include optimizing forward error correction (FEC)-gain sharing by choosing a grouping of wavelength division multiplexing (WDM) carriers. In another example, the system margin optimization mechanism may include adding WDM carriers while maintaining constant network capacity. In a further example, the system margin optimization mechanism may include adding network capacity by adding WDM carriers.

In an example, the SDN controller may include a proactive decision engine. Further, the SDN controller may be a hybrid SDN controller. In addition, the optical system performance metric may include at least one of a Q-Factor metric, a transmission metric, a reception metric, a photonic integrated circuit (PIC) metric, a digital signal processing (DSP) metric, a transponder metric, a power metric, a chromatic dispersion metric, a signal to noise ratio metric, a bit error rate (BER) metric, a wavelength division multiplexing (WDM) metric, a crosstalk metric, an optical amplification gain level metric, an erbium doped fiber amplifier (EDFA) a gain level metric, a Raman gain level metric, an optical fiber characteristic metric, an optical power monitor metric, an optical time domain reflectometry (OTDR) metric, a multi-protocol label switching (MPLS) tunnel utilization metric, an optical transport network (OTN) tunnel utilization metric, a label switched path (LSP)-round-trip delay (RTD) metric, a baud rate metric, a bit rate metric, a carrier capacity metric or a fiber capacity metric.

In a further example, a transponder may generate an assessment of deployed carriers. For example, a transponder may receive a test sequence, for an optical system performance metric, over a set of deployed carriers. In an example, deployed carriers of the set are not carrying client data. The transponder may then compare the received test sequence against a known test sequence. Further, the transponder may generate an assessment of the deployed carriers not carrying client data based on the comparison of the received test sequence and the known test sequence. Then, the transponder may transmit a measurement of the optical system performance metric, which includes the assessment of deployed carriers not carrying client data.

In a further example, the transponder may transmit an optical signal carrying client data over another set of deployed carriers. In another example, the test sequence may be at least one of a random bit sequence, a pseudo-random bit sequence or a deterministic bit sequence.

BRIEF DESCRIPTION OF THE DRAWINGS

FIGS. 3A, 3B, 3C, 3D, 3E and 3F are workflow diagrams illustrating an example of a centralized SDN controller providing proactive protection in a multi-channel network;

DETAILED DESCRIPTION OF THE EMBODIMENTS

Figure 1:
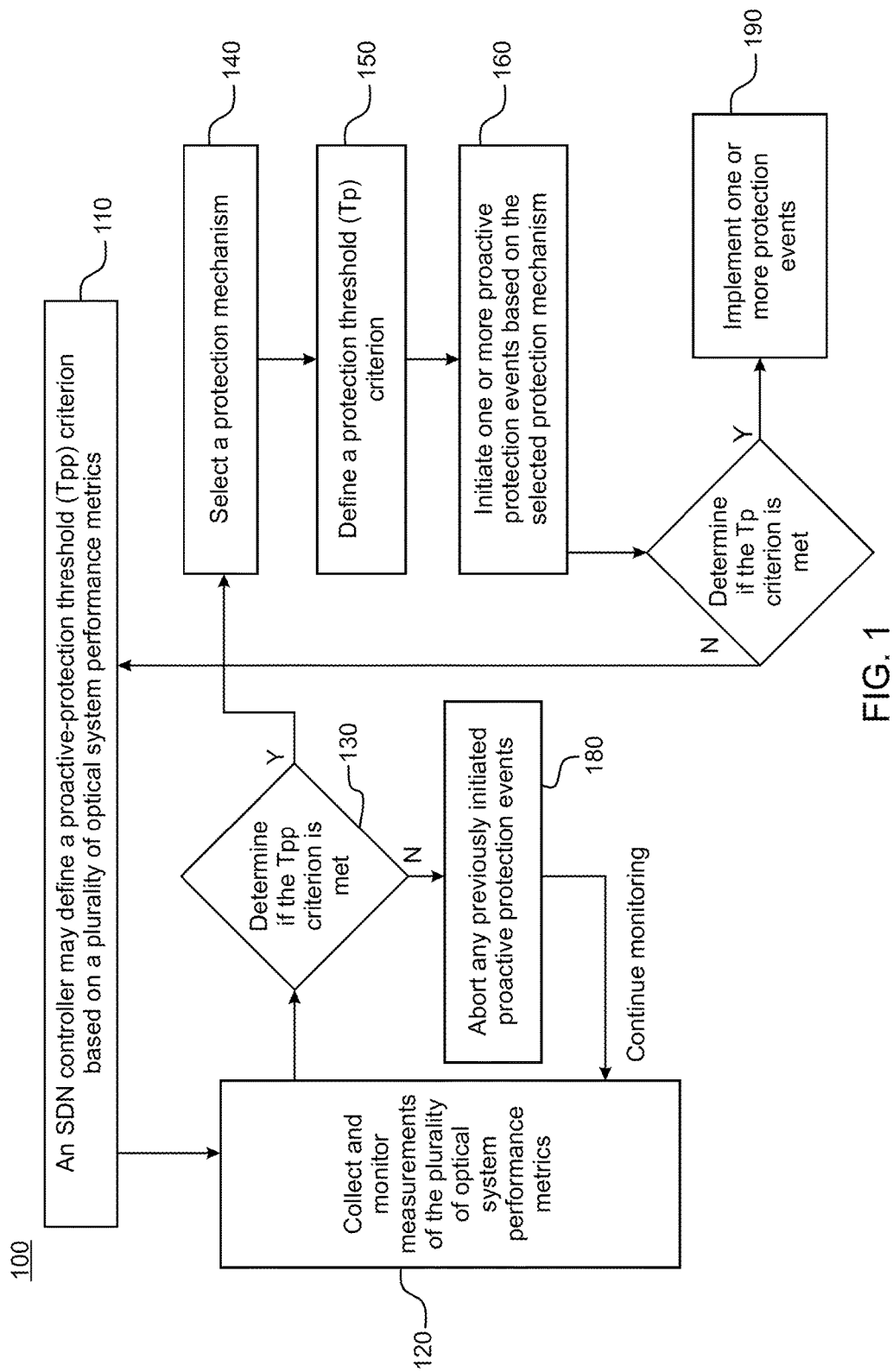
FIG. 1 is a flow chart illustrating an example of a software defined network (SDN) controller providing proactive protection in a packet-optical network.

Examples and embodiment described herein provide for improved margin optimization in optical networks, including optical transport networks. In an optical network, optical signals carrying packets may be transmitted from one node to another. In an example, a software defined network (SDN) controller using an SDN control plane may monitor and analyze, in real-time, optical system parameters for an optical network. When a parameter value meets a specific optical system performance criterion, the SDN controller may select an appropriate system margin optimization mechanism, at the appropriate network layer. For example, the system margin optimization mechanism may be forward error correction (FEC)-gain sharing by choosing a grouping of wavelength division multiplexing (WDM) carriers. In another example, the system margin optimization mechanism may be adding WDM carriers while maintaining constant network capacity. In a further example, the system margin optimization mechanism may be adding network capacity by adding WDM carriers. The SDN controller may also define a system margin optimization threshold criterion. When the system margin optimization threshold criterion is met, the SDN controller may implement one or more optimization events.

Examples and embodiment described herein also provide for improved protection in packet-optical transport networks. In a packet-optical network, optical signals carrying packets are transmitted from one node to another. In an example, a SDN controller using an SDN control plane may monitor and analyze, in real-time, optical system parameters for a packet-optical network. When a parameter value crosses a specific system performance threshold based on a predefined procedure, the SDN controller may pro-actively trigger an appropriate protection scheme, at the appropriate network layer. For example, the SDN controller may provide for pro-active re-routing of traffic to avoid failures. Further, the SDN controller may then predictively evaluate a determined re-route path and determine if a parameter value crosses a specific system performance threshold for the re-route path. Based on the re-route path crossing a threshold, the SDN controller may then select another re-route path and evaluate that path. The SDN controller may continue to select and evaluate re-route paths until an acceptable re-route path is found.

The optical system parameters may include those used in systems having a "flight data recorder" (FDR). Further, a plurality of optical system parameters may be monitored.

Also, the SDN control plane may be a multi-layer control-plane. Further, an all-SDN control plane approach or centralized control plane approach provides previously unattainable functions of pro-active re-routing of existing WDM service on a particular optical fiber or fiber path.

In an example, the SDN controller may enable WDM layer protection by pro-actively initiating all WDM system calibrations in ways that would accelerate the WDM system response time to be within the network acceptable time limits. Such proactive calibrations could also take into account specific network characteristics. In an example of multi-fiber network implementations, the SDN controller may combine analytics from multiple WDM systems to provide proactive protection. The SDN controller may then further implement protection events based on a determination that a protection threshold is met.

As used herein, an SDN controller may refer to one, several or all different types of SDN controllers known to one of ordinary skill in the art. These types of SDN controllers may include, for example, multilayer or single layer SDN controllers, and centralized controllers, de-centralized SDN controllers, or hybrid SDN controllers. A centralized controller may be considered to be a single entity which controls the underlying network. A de-centralized SDN controller may be considered to be a collection of federated SDN controllers that logically act as a centralized controller. A hybrid SDN controller may be considered to be a controller that operates on the SDN principles but also rely on nodal control plane such as generalized multi-protocol label switching (GMPLS). Further, a hybrid SDN controller is a mid-point control option between an all-SDN control plane approach and a legacy network element ("nodal") control plane approach, typically without SDN control. In a legacy control plane approach, each node may independently route its network traffic, whereas in an all-SDN control plane approach the SDN controller routes network traffic for each node. A native SDN control plane approach and a pure SDN control plane approach may refer to an all-SDN control plane approach, and the terms may be used interchangeably. Further, a hybrid SDN controller has the capabilities of a centralized SDN controller and programs every node hop-by-hop along the end-to-end path on which a service needs to be created. Also, a hybrid SDN controller has the capabilities of a de-centralized SDN controller and program nodes using an embedded nodal control plane, such as, for example, GMPLS to indicate either the head-end node or tail-end node along the end-to-end path to create a service.

A native SDN controller may have complete visibility of device to device or port to port connectivity. In an example, an SDN controller may rely on data path verification tools to ensure connectivity correctness. Further, the SDN controller may initiate data path connectivity verification using trail-trace-identifiers (TTI), an Internet Protocol (IP) ping, a Label Switched Path (LSP) ping, and the like.

A hybrid SDN controller may have partial visibility of the underlying networks. In typical examples, a hybrid SDN controller may only be aware of edges of the layer or domain boundaries. Further, network devices which the SDN controller communicates with may send a summary to the Controller of the state of the network. Within the domain, the network devices may rely on an embedded control plane for routing and signaling. Also, path computation may be performed by the hybrid SDN controller with assistance from the embedded control plane. The SDN controller may communicate with the edge network devices and request them to setup services. The SDN controller may also monitor the edge network devices. Further, network devices in each of the layers may rely on the control plane to provision and re-route traffic. Additionally, the network devices may summarize the network state and inform the SDN controller of this summary by using border gateway protocol (BGP) BGP-link state (BGP-LS), path computation element protocol (PCEP) and the like.

Approaches using SDN controllers are improvements over prior methods and were previously unattainable. Network operators have long understood that packet layers, such as an IP layer, a multi-protocol label switching (MPLS) layer or both, can be acceptable for the requirements of packet-optical network protection mechanisms, which typically require responses of no more than a few tens of milliseconds. As a result, IP/MPLS protection mechanisms have been widely adopted. Accordingly, the use of a WDM layer for protection and restoration mechanisms have not been previously widely adopted because the protection and restoration mechanisms of WDM systems have usually been limited to response times in an order of minutes, which is thus a much slower response than required. As used herein, network operator may refer to traditional network service providers as well as content providers.

In order to mitigate WDM slow response times, elaborate WDM restoration mechanisms have been developed. However, these mechanisms have rarely been adopted since packet-level WDM restoration and WDM protection typically fail to achieve the performance needed in most cases and increase network management complexity. In addition, time division multiplexing (TDM)-based protection mechanisms, such as optical transport network (OTN) switching, have been developed to offer an alternative to IP/MPLS protection. However, TDM-based protection mechanisms have not been as widely adopted as IP/MPLS protection mechanisms for IP/MPLS packet transport.

While improving transport network protection by coordinating among the packet and optical network layers has long been very attractive, such protection has remained limited until now mainly due to the lack of a mature and effective coordination process. For example, network management system (NMS)/element management system (EMS) protection has been used in optical networks by network controllers but rarely available in optical routers. Further, NMS/EMS has been too slow for effective coordination among the packet and optical transport layers. Also, while GMPLS has been defined as a unified control-plane in order to extend the IP/MPLS control-plane paradigm to optical networks, GMPLS has not been effectively adopted for multi-layer protection.

In another example, multi-layer proactive protection mechanisms may use pre-FEC WDM information. However, in practical application, these mechanisms provide IP/MPLS layer only protection and not WDM layer protection. Further, the adoption of these mechanisms have been limited by their single channel nature, which limits the ability of these mechanisms to define an appropriate proactive trigger for most network protection cases.

Recent SDN evolution of networks using IP/MPLS layers to include a hybrid control plane, or even a centralized only control plane, shall enable beneficial control for packet-optical transport, in implementations with or without GMPLS. A hybrid control plane may be considered to be a hybrid of a centralized control plane and a de-centralized control plane. In a specific example, an SDN controller may interface directly with IP/MPLS and optical layers independently. In a further example, the SDN controller may interface only with the IP/MPLS layer(s), which may use GMPLS to interact with the optical layer.

In addition, traditional static WDM layer monitoring made limited use of optical system analytics and typically, the FEC bit error rate (BER) was the main parameter monitored in optical networks. However, newer, coherent, flex-grid WDM systems have provided significant motivation for the development of more advanced optical system analytics applied at the WDM layer. For example, an FDR may include a database that stores hundreds of optical system parameters that can be used for such system analytics. These parameters are updated either frequently or continuously such that up-to-date analytics can be provided. Further, the introduction of SDN control by an SDN controller has motivated a significant advancement in network analytics frameworks, such as for information collection and sharing, across all of the layers of a packet-optical transport network. For example, an SDN Controller can collect the results of streaming telemetry schemes from one or more network elements/devices at a relatively high rate. The SDN controller may then run analytics based on the collected results.

Figure 4:
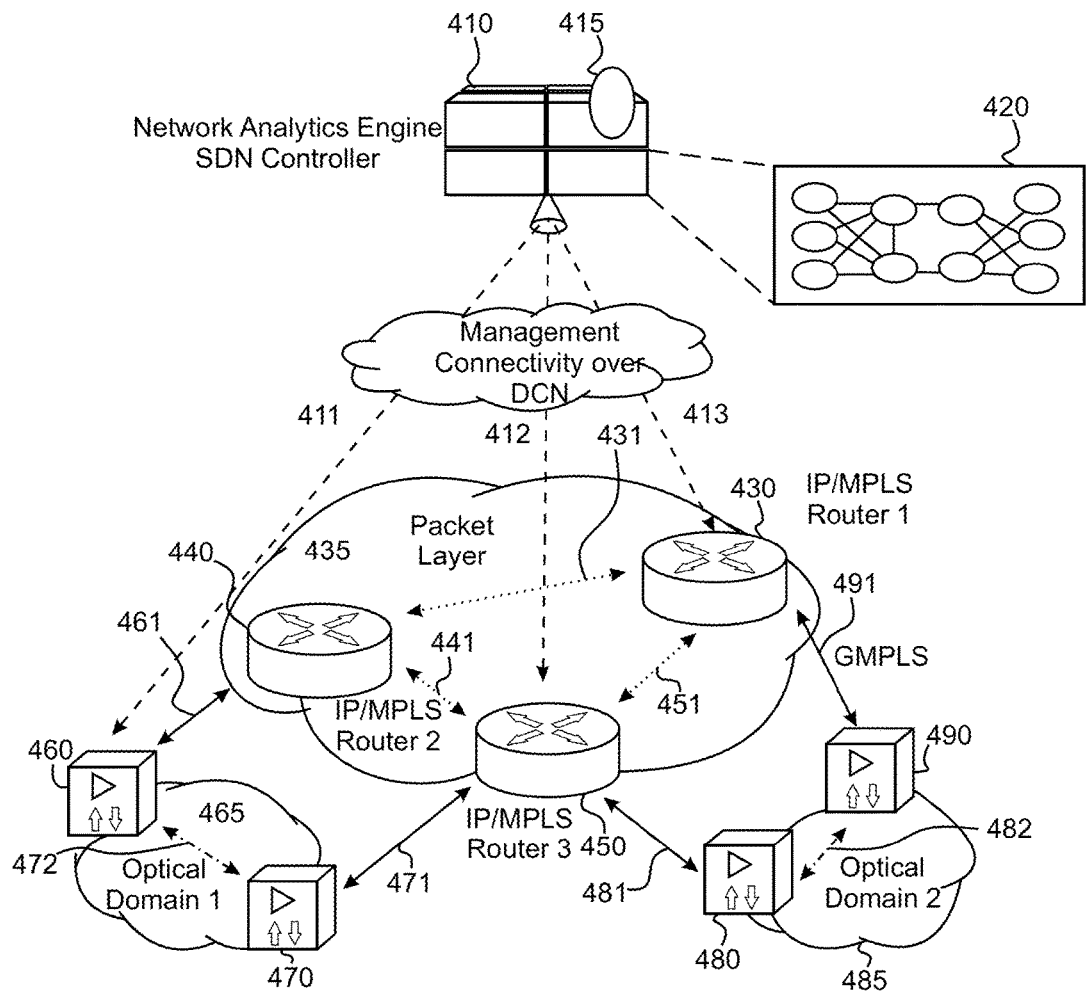
FIG. 4 is a network diagram illustrating an example of an SDN controller providing proactive protection in a multi-fiber network across both the packet layer and the optical layer.
Figure 9:
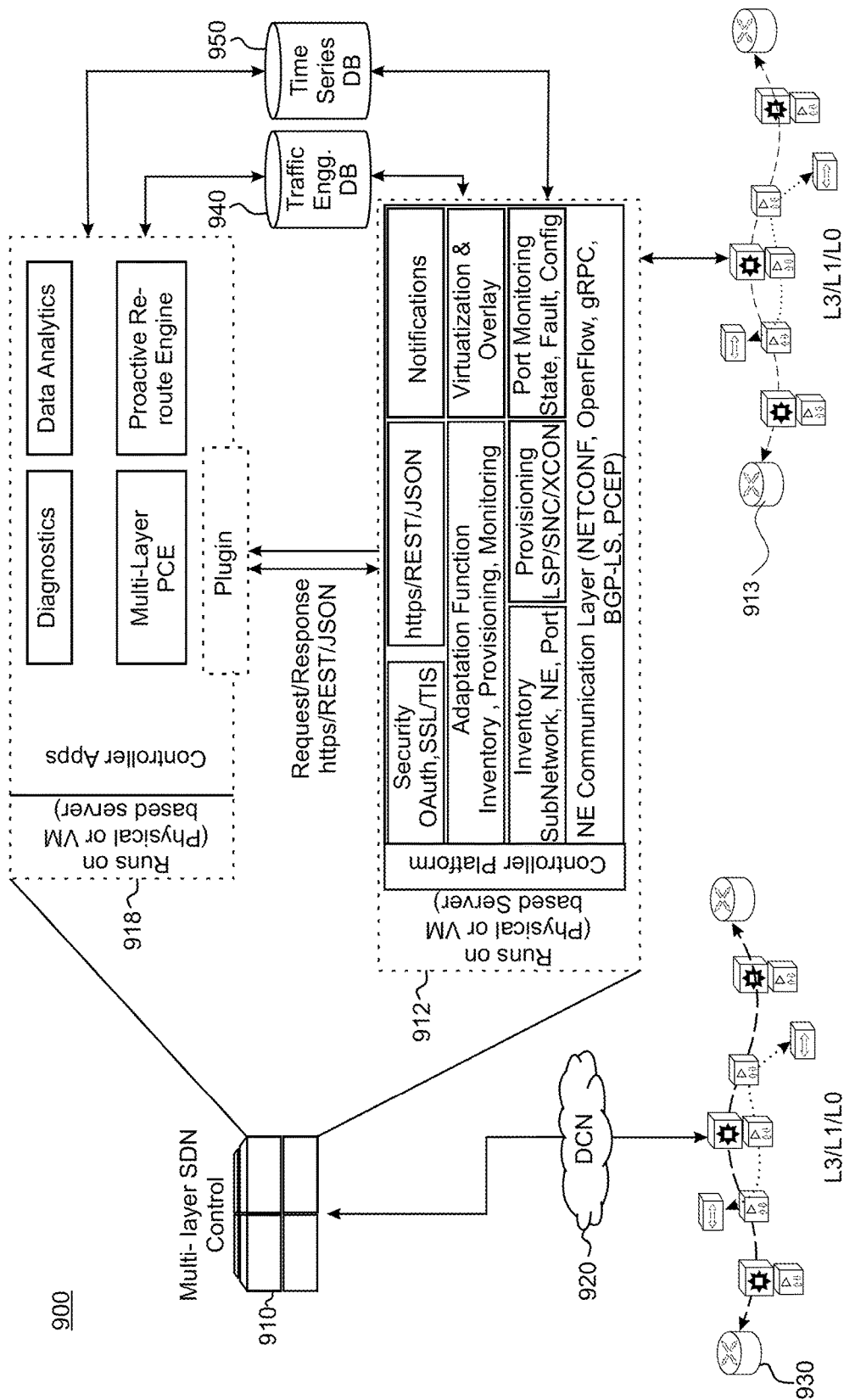
FIG. 9 is a network diagram illustrating an example of a multi-layer SDN controller providing proactive protection in a multi-fiber network, and the platforms and applications of the SDN controller.

FIG. 1 is a flow chart illustrating an example of an SDN controller providing proactive protection in a packet-optical network. As shown in an example in chart 100, an SDN controller may define a proactive-protection threshold (Tpp) criterion based on a plurality of optical system performance metrics, at step 110. The SDN controller may then collect, monitor and store the plurality of optical system performance metrics, step 120. In an example, a generic remote procedure call (gRPC) may periodically send or stream measured optical system performance metrics from an optical device in the network to the SDN controller. In this way, the SDN controller may monitor the optical system performance metrics. Further, the optical system performance metrics may be archived in a network analytics time series database, which may complement the SDN controller. The database may be a database as shown in FIG. 4, FIG. 9 or both.

Further, the SDN controller may perform active profiling of the optical system performance metrics. For example, based on the archived optical system performance metrics, the SDN controller may build a correlation hysteresis to identify threshold crossing events.

Accordingly, while conducting continuous collection and monitoring, the SDN controller may determine if the defined Tpp criterion is met 130. If the Tpp criterion is met, the SDN controller may select a protection mechanism 140. In an example, the protection mechanisms may be pre-defined by a network operator. Also, the Tpp criterion may be pre-defined by a network operator.

In another example, the protection mechanisms may not be pre-defined by the network operator. In addition, the Tpp criterion may be pre-defined with a default criterion, such as a default event or condition. In an example, a default criterion may be a Q-Factor, as explained further below.

In addition, the SDN controller may define a protection threshold (Tp) criterion 150. Further, the SDN controller may then initiate one or more proactive protection events based on the selected protection mechanism 160. In an example, the SDN controller may program the required layer 3/layer 0 connections/LSPs on alternate paths and switch the end-to-end traffic over these alternate paths. For example, the SDN controller may use device programmable application programming interfaces (APIs), such as OpenFlow and the like, to initiate the one or more proactive protection events.

Also, the SDN controller may determine if the Tp criterion is met 170. In an example, the Tp criterion may be more stringent as the Tpp criterion. If another example, the Tp criterion may be the same as the Tpp criterion. In an example, the Tp criterion may be met if the SDN Controller observes an equipment degrade (EQPT-DEGRADE) alarm anywhere in the network. Such an EQPT-DEGRADE may be emitted when a hardware component, such as a photonic integrated circuit (PIC), wears out. Further examples of Tp criteria are provided elsewhere herein. If the Tp criterion is met, the SDN controller may implement one or more protection events 190.

If the Tp criterion is not met, the SDN controller may again define a Tpp criterion 110. Further, the SDN controller may continue collecting and monitoring the one or more optical system performance metrics 120. In addition, if the Tpp criterion is not met, the SDN controller may abort any previously initiated and currently activated proactive protection events 180. Further, the SDN controller may continue collecting and monitoring the one or more optical system performance metrics. Further, while the SDN controller implements steps 130 through 180, it may continue to collect and monitor the one or more optical system performance metrics. In these ways, the SDN controller may collect and monitor optical system performance metrics continuously.

In an example, the SDN controller may enable WDM layer protection by pro-actively initiating all WDM system calibrations in ways that would accelerate the WDM system response time to be within the network acceptable time limits. Such proactive calibrations could also take into account specific network characteristics. For example, the specific network characteristics of a point-to-point network could be taken into account. In another example, the specific network characteristics of a mesh network could be taken into account.

Further, proactive protection may include proactive tuning of spare WDM channels at a sufficient time before an actual protection event occurs, so that WDM response time meets required timelines. The spare WDM channels may be WDM channels that have been pre-deployed but initially unused until called upon. Further, the spare WDM channels may be used in a WDM PIC-based system. In typical examples, the required timelines usually measure less than a second.

In examples using a multi-fiber network, the SDN controller may use shared risk link group (SRLG) information. Specifically, the SDN controller may use the SRLG information to make protection-switching decisions intelligently. For example, the SDN Controller may use the SRLG information to determine that one wavelength in the fiber is degrading, and may therefore infer a likely degradation of other wavelengths incident on the same fiber link.

In further examples, non-WDM layer protection may be improved by the SDN controller. For example, the SDN controller may advance packet protection by pro-actively initiating protection switching at the packet client layer, which will typically be the IP or MPLS layer. Such protection switching may be part of fast re-route (FRR). Further, the SDN controller may advance OTN protection, which may include optical carrier protection, by using this approach to pro-actively initiate protection switching at the OTN layer or any other TDM layer, most obviously for the case of non-IP/MPLS traffic that cannot be protected at the WDM layer.

As used herein, a carrier may refer to a channel or a wavelength and the terms may be used interchangeably. A trunk may refer to a link that may carry a plurality of carriers, channels or wavelengths.

The example mechanisms discussed herein may monitor multiple optical system performance parameters and allows the definition of performance metrics that combine many of these parameters to establish the most appropriate protection thresholds or criteria. In some examples, the mechanisms may monitor as many parameters as possible. As a result, the example mechanisms discussed herein extend well beyond prior solutions which consider only BER monitoring of a single WDM channel for IP/MPLS proactive protection. Importantly, the currently proposed correlation among multiple WDM channels may allow for much better proactive protection decisions by the SDN controller. For example, such improved proactive protection decisions may include distinctions between fiber-wide (or even multi-fiber) degradation versus channel-specific degradation. Such a distinction would be impossible through any single channel monitoring, like the ones proposed in prior solutions.

Typical example optical system performance parameters monitored by the SDN controller in the proposed example mechanisms discussed herein may include single-channel metrics of transmission and reception as measured or determined by a transmitter and/or receiver, including, for example, a PIC. Digital signal processing (DSP) metrics like power, chromatic dispersion, signal to noise ratio, BER, and the like. DSP metrics may be generated by the DSP, which may be implemented as specialized hardware, such as, for example, an application specific integrated circuit (ASIC). In addition to providing DSP metrics, DSP perform FEC, coherent detection and the like.

Other example parameters may include aggregated WDM channels metrics like power, crosstalk, optical amplification (Erbium Doped Fiber Amplifier (EDFA) or Raman) gain levels. Further, the SDN controller may even monitor optical fiber characteristics, such as loss, as these may become available from Optical Power Monitor and Optical Time Domain Reflectometry (OTDR) functionality.

In a typical example, a network operator user may define a procedure or an algorithm including a system performance threshold that could trigger a pro-active protection event. For example, the procedure may determine if increasing levels of pre-FEC BER is a channels specific degradation, or a degradation observed among many, or potentially all, WDM channels in which case a whole-fiber pro-active protection event would be needed. Such a degradation observed among multiple WDM channels and the associated trigger of a pro-active protection event would have impossible in prior solutions, which typically considered only single channel effects.

In addition, compared with prior solutions, the use of the SDN controller in the proposed example mechanisms discussed herein allows for much more flexibility, and better optimization of the network layer at which the pro-active protection mechanism would be initiated, because an SDN controller can enable proactive protection at the WDM layer in addition to the packet IP/MPLS layer or the OTN layer, due to the SDN Controller having visibility to all of these layers at the same time. Such proactive protection at the WDM layer was not possible before under prior solutions. This is a new and significant improvement over those prior solutions, which consider only IP/MPLS router based pro-active protection.

Moreover, the use of the SDN controller in the proposed example mechanisms discussed herein allows the SDN controller to have better visibility of activity of the network. Accordingly, the SDN controller may manage the network in a centralized way. For example, the SDN controller may make management decisions based on a full view of the network.

In addition, the use of the SDN controller in the proposed example mechanisms allows for decision-making based on correlation of system analytics among different layers. For example, the system analytics may include OTN or MPLS tunnel utilization.

Further, the use of a stateful SDN controller further allows for network analytics with much better predictive ability. In an example, this predictive ability may be due to improved correlations of performance degradations with different timescales. One of ordinary skill in the art will understand that the lack of accurate predictive ability has been the main limitation of the proactive protection schemes, which are based on single-parameter network-monitoring, such as those in prior solutions. In contrast to prior solutions, in the examples described herein, the proactive protection threshold criterion may be met based on the collected measurements of a plurality of carriers.

Also, the SDN controller in the proposed example mechanism allows for the use of heuristics and/or data mining techniques to perform predictive analyses on possible failures in the network, with a determined percentage of confidence, based upon historical data. The SDN controller may make different degrees of failure determination, such as, for example, determining if a group of fibers will fail or even if an individual fiber will fail.

As a result, the SDN controller provides for pro-active re-routing of traffic to avoid failures. Further, an all-SDN control plane approach or centralized control plane approach provides previously unattainable functions of pro-active re-routing of existing WDM service on a particular fiber path.

For example, a single optical carrier or optical channel (OCh) may be pro-actively re-routed to an alternate path. In a further example, a group of optical carriers or an optical channel group (OCG) may be pro-actively re-routed to an alternate path.

In examples described herein, the alternate path may be a pre-computed, dedicated path that matches the original path in characteristics and metrics one-to-one. The alternate path may be a backup to the existing original path, which may be susceptible to failures. In further examples described herein, the alternate path may be dynamically computed by the SDN controller, as the SDN controller profiles and monitors the health and metrics of the carrier or group of carriers, such as an OCh, OCG or both. Further, the SDN controller may also take into account SRLG information in order to infer the potential impact to a collection of carriers, such as on OCG, which share common resources.

The SDN controller may monitor one or more of several different types of optical parameters and may determine if a threshold is met based on an indicator of one of these parameters. For example, the SDN controller may monitor carrier parameters, WDM system parameters and fiber parameters. Specifically, the SDN controller may monitor a variety of carrier parameters, such as SRLG, which may be a logical parameter and BER, which may be an digital parameter. Further, the SDN controller may monitor a variety of analog carrier parameters, such as Q-Factor, transmission power, receive power, chromatic dispersion, polarization mode dispersion (PMD), jitter, and the like. Also, the SDN controller may monitor a variety of WDM system parameters, such as SRLG, EDFA-power, which may be an analog parameter, carrier count, which may be a digital parameter, and the like. In addition, the SDN controller may monitor a variety of fiber parameters, such as OTDR, which may be an analog parameter, and the like.

The SDN controller may use objective functions to represent the optimization coefficients of the state the network will be in if the re-route were to occur. There may be several objective functions, which are associated with priorities. In an example, the SDN controller may set to objective functions, with a first objective function to evaluate low latency, least cost and/or hop count, and a second objective function to evaluate least cost, minimal regeneration and low power. For example, the SDN may set the following: $OF_1=\{(low\ latency), (least\ cost), (lowest\ hop\ count)\}$ and $OF_2=\{(least\ cost), (minimal\ regeneration), (lower\ power)\}$.

Figure 2A:
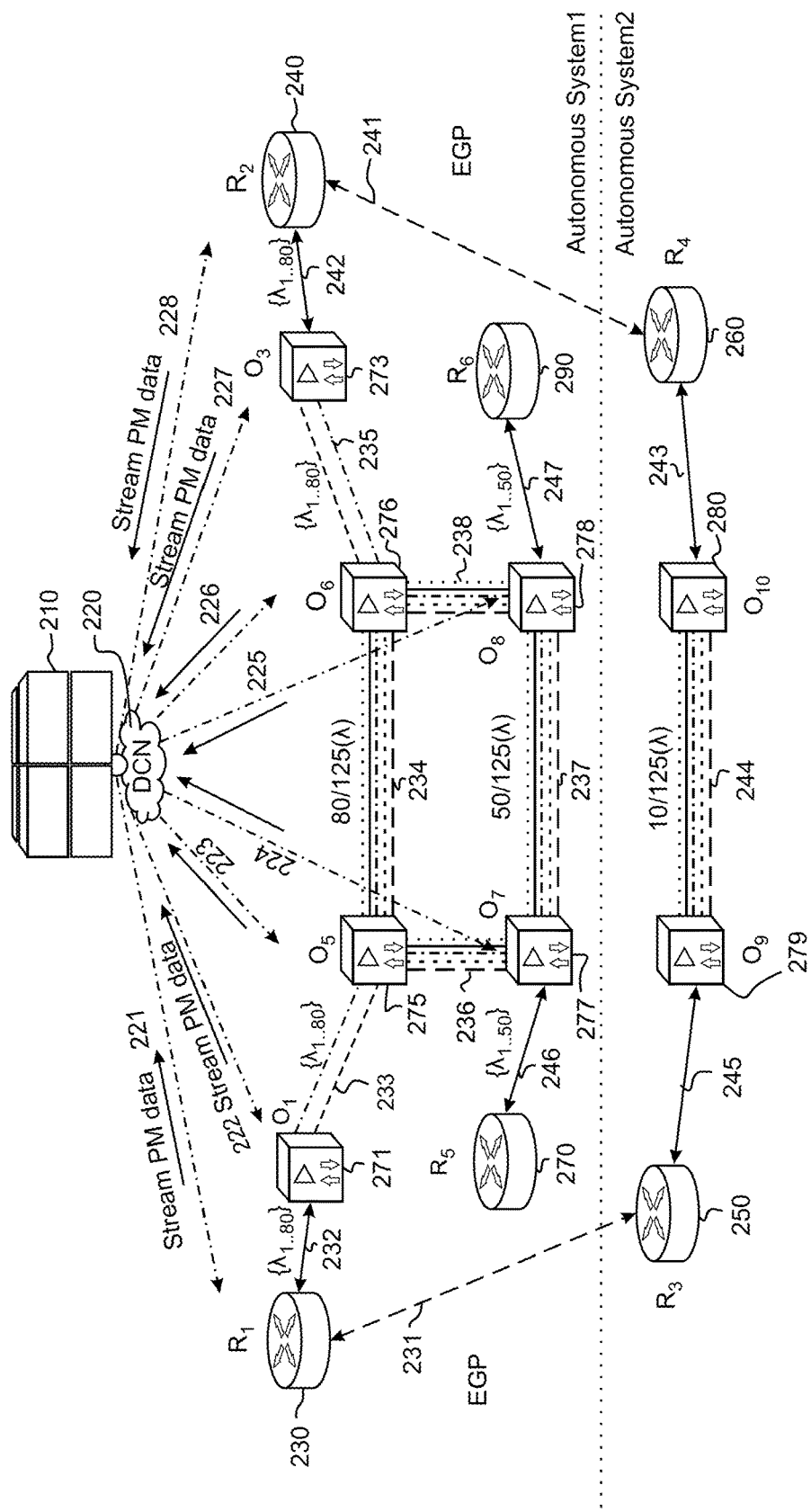
FIG. 2A is a network diagram illustrating an example of a centralized SDN controller providing proactive protection in a multi-channel network at steady state before pro-active protection is applied.
Figure 2B:
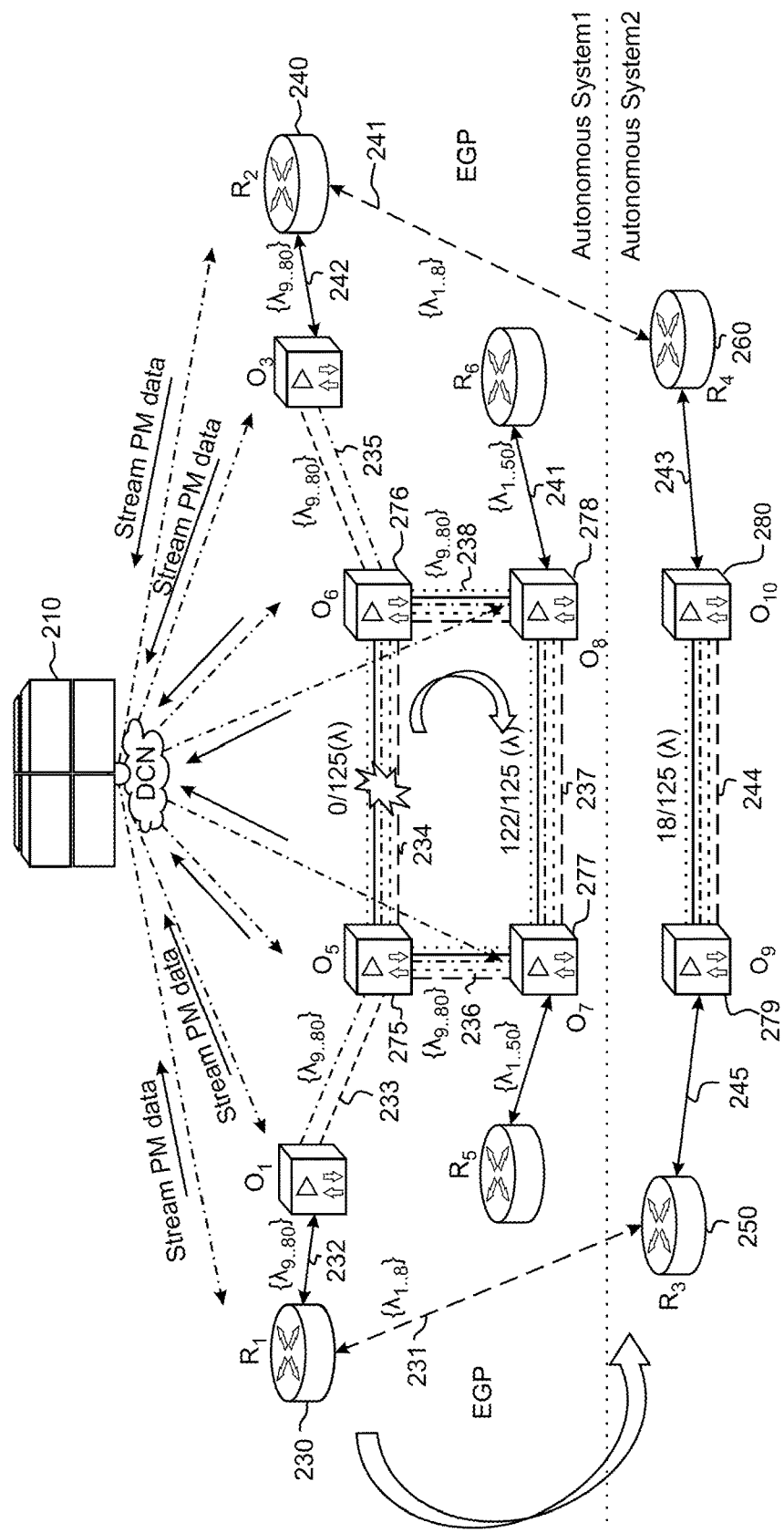
FIG. 2B is a network diagram illustrating an example of a centralized SDN controller providing proactive protection in a multi-channel network at end state after pro-active protection has been applied.

FIG. 2A is a network diagram illustrating an example of a centralized SDN controller providing proactive protection in a multi-channel network at steady state before pro-active protection is applied. FIG. 2B is a network diagram illustrating an example of a centralized SDN controller providing proactive protection in a multi-channel network at end state after pro-active protection has been applied. FIGS. 3A, 3B, 3C, 3D, 3E and 3F are workflow diagrams illustrating an example of a centralized SDN controller providing proactive protection in a multi-channel network. The examples shown in FIGS. 2A, 2B, 3A, 3B, 3C, 3D, 3E and 3F may be an example implementation of the process shown in FIG. 1.

In an example as shown in network diagram 200, SDN controller 210 may communicate and have management connectivity with one or more routers and/or one or more optical add/drop multiplexing (OADM) devices over communication paths in a management network, such as a data communications network (DCN) 220. For example, SDN controller 210 may communicate with router 230 over path 221, OADM 271 over path 222, OADM 275 over path 223, OADM 277 over path 224, OADM 278 over path 225, OADM 276 over path 226, OADM 273 over path 227, and router 240 over path 228. The routers and OADMs may stream performance-monitoring (PM) data to SDN controller 210. The management connectivity implemented through communications 221-228 may use protocols such as Open-Flow, network configuration protocol (NETCONF), simple management network protocol (SNMP), command line interface (CLI), and the like. The SDN controller 210 may include a proactive decision protection engine (not shown in FIG. 2A or 2B), which may be complementary to the SDN controller 210. The routers 230, 240, 250, 260, 270, 290, may be IP/MPLS routers, which may perform IP routing as well as MPLS encapsulation. OADM devices 271, 273, 275-280 may be layer 0 devices and may perform optical add/drop multiplexing. Further, each of OADM devices 271, 273, and 275-280 may be a re-configurable OADM (ROADM) or a fixed OADM (FOADM). In addition, routers 230, 240, 250, 260, 270, 290 and OADM devices 271, 273, 275-278 may be part of an autonomous system 1, while routers 250, 260 and OADM devices 279, 280 may be part of an autonomous system 2.

As shown in workflow diagram 300 of FIG. 3A, at stage 310, time t=$t_0$ the SDN controller 210 may define a Tpp as a threshold criterion based on a plurality of performance metrics. Stage 310 may correspond to step 110 of FIG. 1. In an example, Tpp may be a function of X, Y and Z (or F(X, Y, Z)), where X, Y and Z are performance metrics. In another example, Tpp may be a function of X and Y. Further, in an example, a user of the network operator may use representational state transfer (REST) and a RESTful API as a configuration interface to input the Tpp into the SDN controller 210.

In an example, performance metric X may be a single carrier or a single channel performance metric, such as Q-Factor, optical signal to noise ratio (OSNR), BER and the like. Such metrics may be indicative of per carrier or per channel health. For example, X may be set as a Q-Factor for every carrier ($\Delta$), accordingly: X=Q-Factor$_{i=1 \ldots N}$ for every $\lambda_{1=1 \ldots N}$, where N represents the total number of carriers monitored by the SDN controller.

Further, performance metric Y may be a fiber physical performance metric, such as an optical Raman amplifier pump power ($P_{out}$) and the like. Such a fiber physical performance metric may be indicative of characteristics of the fiber, which may carry all of the channels together. As a result, fiber characteristics may impact all of the channels that ride over the fiber.

In addition, performance metric Z may be a service performance metric such as a LSP round-trip delay (RTD). The RTD may be the sum of channel propagation delay (PD) in each of the two directions in a path. RTD may be determined or computed through many ways. One way to determine RTD may include an ITU International Telecommunications Union (ITU) Telecommunications Standardization Sector (ITU-T) G.709 path delay measurement scheme to obtain carrier level latency. This measurement scheme may provide the RTD on a per-ODU k logical path. The RTD measurements may be performed on-demand or may be performed automatically at the direction of the SDN controller at pre-configured intervals.

In an example, the SDN controller 210 may set the Tpp thresholds including X and Z. Accordingly, the SDN controller 210 may set X as Q-Factor$_{i=1 \ldots N}$ for every $\lambda_{1=1 \ldots N}$ less than or equal to an a criterion for a path. In other words, the network operator may expect the Q-Factor for all of the channels of that path to be less than or equal to $\alpha$. For example, based on inputs from a user of the network operator, the SDN controller 210 may set X as Q-Factor$_{i=1 \ldots N}$ less than or equal to $\alpha_i$ for every $\lambda_{1=1 \ldots N}$ for path 234 between OADM 275 and OADM 276, where N is 125 channels. Further, the SDN controller 210 may set Z as RTD$_{i=1 \ldots N}$ less than or equal to a $\delta_i$ criterion for every $\lambda_{i=1 \ldots N}$. The RTD$_{i=1 \ldots N}$ measures the delay over the path between router 230 and router 240. In an example, for path 234 between router 230 and router 240, $\alpha$ may be 7 and $\delta$ may be 4 ms. In further example, $\alpha$ may be expressed logarithmically. For example, for path 234 $\alpha$ may be 6.5 dB and $\delta$ may be 5 ms. Further, $\alpha$ may related to a system alarm/fault, such as a Q-SIGNAL-DEGRADE-alarm. Other example values of Q related to Q-SIGNAL-DEGRADE-alarm condition may include the range [9 dB to 15 dB].

In a further example, the SDN controller 210 may set Y as one of the Tpp thresholds. Specifically, the SDN controller 210 may set Y as $P_{out}$ is less than or equal to a ß decibels (dB) criterion for Raman power for all of the Raman amplifiers OADM$_{i=1 \ldots M}$ along the WDM links on the path, where M is the total number of Raman amplifier OADMs along the path. For example, in a path between router 230 and router 240 may include link 232 to OADM 271, then link 233 to OADM 275, then link 234 to OADM 276, then link 235 to OADM 273 and finally link 242 to router 240. Accordingly, M may be 4 in that example as there are four OADMs along the path between router 230 and router 240. In an example ß may be 55 dBs. Other paths that may be measured for a $P_{out}$ include path 237 between OADM 277 and OADM 278 and path 244 between OADM 279 and OADM 280. The above described examples are some of the ways that step 110 of FIG. 1 may be performed.

In addition, in an example, step 150 may be performed at stage 310. For example, at stage 310, the SDN controller 210 may define Tp thresholds. For example, the SDN controller 210 may define a Tp threshold as $P_{out}$ is less than or equal to a $\theta$ dB criterion for all of the Raman amplifiers OAD M$_{i=1 \ldots M}$ along the WDM links on the path. In one example, $\theta$ may be set as equal to the ß used for Y above. In another example, $\theta$ may be set as greater than the ß used for Y above.

As the procedure shown in FIGS. 1, 2A, 2B, 3A, 3B, 3C, 3D, 3E and 3F progresses, one, more, or all of the above and below indicated parameters may be continuously monitored by the SDN controller 210 for pro-active traffic re-route. Such continuous monitoring is shown in step 120 of FIG. 1 and may start at stage 310 of FIG. 3A.

In an example, all services on carriers $\lambda_{1=1 \ldots N}$ may be required to meet the Q-Factor $\alpha$ criterion. However, services on carriers $\lambda_{1=1 \ldots 8}$ may be required to additionally meet the RTD $\delta_i$ criterion.

As shown in FIG. 2, the SDN controller 210 may combine analytics from multiple WDM systems to provide proactive protection. The different WDM systems may operate on different optical domains.

In an example, eighty (80) carriers may be needed by a network operator. The network may have a capacity of 125 carriers. For example links 234, 237 may each accommodate up to 125 carriers. In an example, each WDM fiber may accommodate up to 125 carriers, using, for example, the ITU C-Band spectrum at 1530-1565 nm wavelengths. ITU bands, such as the C-band, L-band and S-band may refer to bands described in ITU-T G694.1. While 80 and 125 carriers are shown, one of ordinary skill in the art will readily appreciate that many more carriers, even hundreds of carriers, may be used and still be consistent with the examples provided herein. The network operator may require the operation of 80 carriers in a path between router 230 and router 240. The SDN controller may then route the 80 carriers over a path including links 232, 233, 234, 235, 242.

In an example illustrating features of proactive protection, at step 130 in stage 320 of FIG. 3B, the SDN controller 210 may determine that the Tpp criterion is satisfied. For example, the SDN controller 210 may determine that the Q-Factor exceeds a for at least one of the 80 carriers on link 234. Therefore, link 234 should not be used in the path. As a result, the SDN Controller 210 may then pro-actively compute alternative paths and may select a protection mechanism 140 for one, some or all of the 80 carriers. In an example shown in FIG. 2 and FIG. 3, the SDN Controller 210 may pro-actively compute alternative paths and may select a protection mechanism 140 for all 80 carriers.

For example, the SDN controller 210 may plot a new potential path including links 232, 233, 236, 237, 238, 235, 242. However, the SDN controller 210 may determine that the end-to-end RTD exceeds the service level agreement (SLA) of Si for eight of the carriers ($\lambda_{1=1 \ldots 8}$). As a result, the SDN controller 210 may plot a separate, new path for the eight carriers which includes links 231, 245, 244, 243, 241 and which meet the RTD requirements of the eight carriers. Further, the SDN controller 210 may plot this new, separate path using layer 3 (L3) restoration and protection mechanisms. The remaining seventy-two (72) carriers of the 80 carriers may remain plotted on the path including links 232, 233, 236, 237, 238, 235, 242.

Further, at stage 330 in FIG. 3C, the SDN controller 210 may initiate one or more proactive protection events based on the selected protection mechanism 160. For example, the SDN controller 210 may establish the path for the eight carriers based on the plot. As a result, the SDN controller 210 may establish a path including links 231, 245, 244, 243, 241 for the eight carriers, as shown in FIG. 2B. In an example, links 231, 241 may use an exterior gateway protocol (EGP), which may be similar to a BGP or a BGP-LS.

In addition, at stage 330, SDN controller 210 may define the Tp criterion, if it has not already been established. The Tp criterion may be applicable to both the path including links 231, 245, 244, 243, 241 for the eight carriers and the path including links 232, 233, 236, 237, 238, 235, 242 for the remaining 72 carriers.

Moreover, at stage 340 in FIG. 3D, the SDN controller 210 may determine if the Tp criterion is met 170. In an example, the Tp criterion is met for the 72 carriers because the measured Raman pump amplifier optical output may approach the threshold θ dBm for link 234 between OADM 275 and OADM 276. Alternatively, the SDN controller 210 may determine if the Tpp criterion is met at this stage. In an example, the Tpp criterion is met for the 72 carriers because the measured Raman pump amplifier optical output may approach the threshold θ dBm for link 234 between OADM 275 and OADM 276.

At stage 340, as the measured Raman pump amplifier optical output may approach the threshold for link 234 between OADM 275 and OADM 276, all 72 carriers for this link face the prospect of disruption. However, these 72 carriers may not have the same latency SLA requirements as the other 8 carriers. For example, these 72 carriers may have higher acceptable RTD than the other 8 carriers.

Therefore, at stage 350 in FIG. 3E, the SDN controller 210 may establish the plotted path for the 72 carriers including links 232, 233, 236, 237, 238, 235, 242. Further, the SDN controller 210 may implement one or more protection events 190.

At stage 360 in FIG. 3F, the new steady state may be monitored by the SDN controller 210 for the newly established paths, as shown in FIG. 2B. If needed, the SDN controller 210 may continue to perform proactive L0 and L3 protection.

FIG. 4 is a network diagram illustrating an example of an SDN controller providing proactive protection in a multi-fiber network across both the packet layer and the optical layer. As shown in diagram 400, an SDN controller 410 may include a proactive decision engine 415 based on user defined thresholds. The SDN controller 410 may have multi-layer and multi-vendor capabilities. The user may be a manager of a network operator. Further, the SDN controller 410 and the proactive decision engine 415 may draw on one or more databases 420 for information about the network and network system performance metrics, such as, network topology, traffic engineering, performance monitoring and the like. The network may be an optical network. In an example, database 420 may be an FDR.

In an example shown in FIG. 4, the SDN controller 410 may have management connectivity over a management network, such as a DCN, with devices such as routers 430, 440, 450 and OADM devices 460, 470, 480, 490. The management connectivity may be implemented through communication channels, such as channels, 411, 412, 413, and may use protocols such as OpenFlow, NETCONF, BGP-LS, PCEP and the like. In an example case, BGP-LS and PCEP may be used in hybrid mode. The routers 430, 440, 450 may be IP/MPLS routers which may perform IP routing as well as MPLS encapsulation. OADM devices 460, 470, 480, 490 may be layer 0 devices and may perform optical add/drop multiplexing. Each of OADM devices 460, 470, 480, 490 may be a ROADM or a FOADM.

The routers 430, 440, 450 may communicate with each other on the packet layer 435 by way of intra-layer logical connectivity using links 431, 441, 451. For example, routers 430, 440, 450 may have router to router connectivity using logical connectivity, with physical connectivity through an underlying layer. The packet layer 435 may include both data plane and control plane connectivity.

OADM devices 460, 470, 480, 490 may communicate with each other on optical domains 465, 485 by way of inter-optical layer connectivity using links 472, 482. For example, OADM devices 460, 470 may have WDM device to WDM device connectivity with each other over link 472 and OADM devices 480, 490 may have WDM device to WDM device connectivity with each other over link 482. Such connectivity may include long-haul connectivity, such as over 80 kilometers (km), or shorter reach connectivity.

OADM devices 460, 470, 480, 490 may communicate with routers 430, 440, 450 by way of cross-layer port-to-port connectivity using links 461, 471, 481, 491. For example, OADM devices 460, 470 may have cross-layer connectivity with routers 440, 450 over links 461, 471, respectively. Similarly, OADM devices 480, 490 may have cross-layer connectivity with routers 450, 430 over links 481, 491, respectively. Such connectivity may include a short or medium reach optical fiber patch. For example, such connectivity may include 2 km, 10 km or 40 km range connectivity. This cross-layer connectivity may be between layer 3 and layer 1, layer 3 and layer 0 or layer 1 and layer 0.

Through the example connectivity shown in FIG. 4, the SDN controller may communicate with the network to follow the procedures provided in FIG. 2 and FIG. 3. For example, the SDN controller may communicate with the network using the example connectivity shown in FIG. 4 to determine if the Tpp criterion is met and if the Tp criterion is met. Further, through the example connectivity shown in FIG. 4, the SDN controller may communicate with the network to follow the procedures provided in FIG. 11. For example, the SDN controller may communicate with the network using the example connectivity shown in FIG. 4 to determine if the Oc criterion is met and if the Ot criterion is met.

Figure 5:
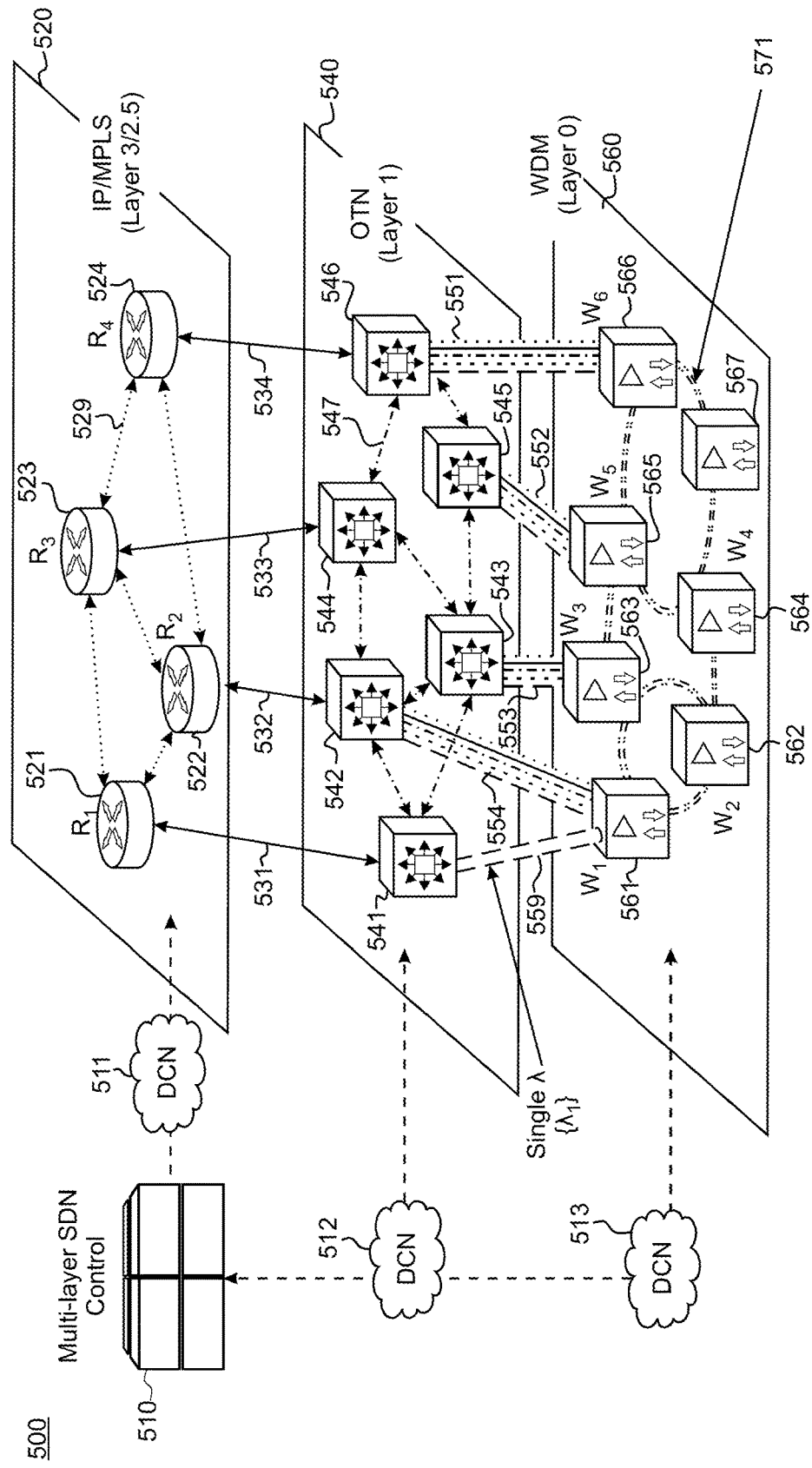
FIG. 5 is a network diagram illustrating an example of an SDN controller providing proactive protection in a multi-fiber network across the Internet Protocol (IP)/multi-protocol label switching (MPLS) layer, the Optical Transport Network (OTN) layer and the wavelength division multiplexing (WDM) layer.

FIG. 5 is a network diagram illustrating an example of an SDN controller providing proactive protection in a multi-fiber network across the IP/MPLS layer, the OTN layer and the WDM layer. As shown in diagram 500, the SDN controller 510 may have management connectivity over a management network, such as a DCN, through communication channel 511 with devices such as routers 521, 522, 523, 524 on IP/MPLS layer 520. The management connectivity may use protocols such as OpenFlow, NETCONF, BGP-LS, PCEP and the like. The IP/MPLS layer 520 may be considered to be layer 3, layer 2.5 or both. Further, the SDN controller 510 may have management connectivity through communication channel 512 with OTN network elements 541, 542, 543, 544, 545, 546 on OTN layer 540. The OTN layer 540 may be considered to be layer 1. The OTN network elements 541, 542, 543, 544, 545, 546 may be ITU-T G.709 capable. Further, the OTN network elements 541, 542, 543, 544, 545, 546 may perform layer 1 functions, such as grooming, multiplexing and switching of optical channel data unit (ODU) k connections and optical channel transport unit (OTU) framing and/or transport of k channels. The output of the OTN network elements 541, 542, 543, 544, 545, 546 may be pipelined to OADM devices, such as OADM devices 561, 562, 563, 564, 565, 566, such as in examples explained further herein. In addition, the SDN controller 510 may have management connectivity through communication channel 513 with OADM devices 561, 562, 563, 564, 565, 566 on WDM layer 560. The WDM layer 560 may be considered to be layer 0.

Similarly to the example shown in FIG. 4, in FIG. 5 the routers 521, 522, 523, 524 may communicate with each other on IP/MPLS layer 520 using logical connectivity links, such as link 529, for example. Further, OTN network elements 541, 542, 543, 544, 545, 546 may communicate with each other on OTN layer 540 using intra-OTN layer links, such as link 549, for example. In addition, OADM devices 561, 562, 563, 564, 565, 566 may communicate with each other on WDM layer 560 using has intra-optical layer connectivity links, such as link 571, for example. Link 571 and similar links may be a fiber span.

OTN network elements 541, 542, 544, 546 may communicate with routers 521, 522, 523, 524 by way of cross-layer port-to-port connectivity using links 531, 532, 533, 534, respectively as shown in FIG. 5. Such port-to-port connectivity may use short or medium reach optical connections and may be similar to port-to-port connectivity shown in FIG. 4.

Similarly, OADM devices 561, 563, 565, 566 may have cross-layer connectivity with OTN network elements 542, 543, 545, 546 over links 554, 553, 552, 551 respectively. OADM device 561 may also have cross-layer connectivity with OTN network element 541 over link 559. In an example, each of links 554, 553, 552, 551 may be a separate collection of N carriers. For example, link 551 may be a collection of carriers $\lambda_{i=1 \ldots N}$. Further, link 552 may be separate collection of carriers $\lambda_{i=1 \ldots N}$. Similarly, links 553, 554 may each be separate collections of carriers $\lambda_{i=1 \ldots N}$. In comparison, link 559 may be a single carrier $\lambda_1$.

Through the example connectivity shown in FIG. 5, the SDN controller may communicate with the network to follow the procedures provided in FIG. 2 and FIG. 3. For example, the SDN controller may communicate with the network using the example connectivity shown in FIG. 5 to determine if the Tpp criterion is met and if the Tp criterion is met. Further, through the example connectivity shown in FIG. 5, the SDN controller may communicate with the network to follow the procedures provided in FIG. 11. For example, the SDN controller may communicate with the network using the example connectivity shown in FIG. 5 to determine if the Oc criterion is met and if the Ot criterion is met.

Figure 6:
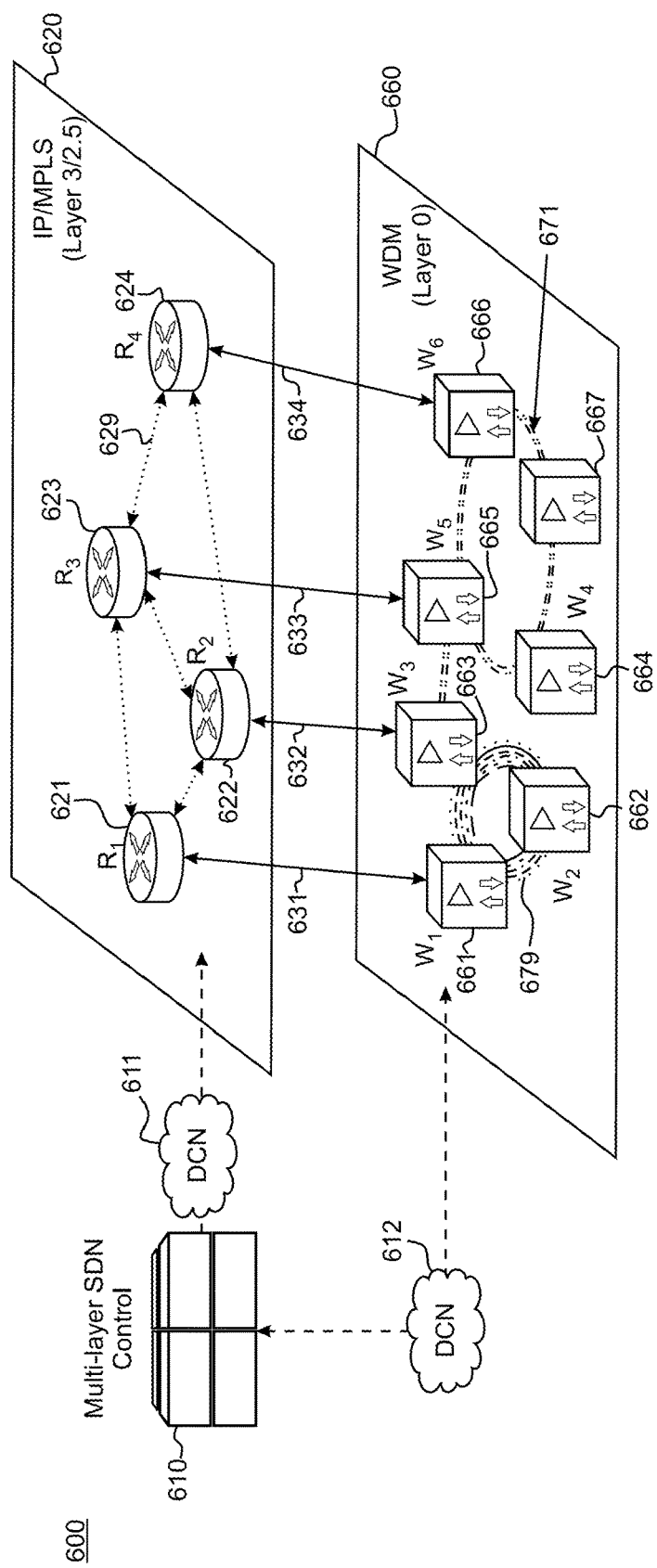
FIG. 6 is a network diagram illustrating an example of an SDN controller providing proactive protection in a multi-fiber network across the IP/MPLS layer and the WDM layer.

FIG. 6 is a network diagram illustrating an example of an SDN controller providing proactive protection in a multi-fiber network across the IP/MPLS layer and the WDM layer. As shown in diagram 600, the SDN controller may communicate over the IP/MPLS layer and the WDM layer in a similar manner to the examples shown in FIG. 5. However, in contrast to the examples shown in FIG. 5, in diagram 600 the SDN controller may not communicate over the OTN layer. Specifically, as shown in diagram 500, the SDN controller 510 may have management connectivity over a management network, such as a DCN, through communication channel 611 with devices such as routers 621, 622, 623, 624 on IP/MPLS layer 620. The IP/MPLS layer 620 may be considered to be layer 3, layer 2.5 or both. In addition, the SDN controller 610 may have management connectivity through communication channel 612 with OADM devices 661, 662, 663, 664, 665, 666 on WDM layer 660. The WDM layer 660 may be considered to be layer 0. The management connectivity may use protocols such as OpenFlow, NETCONF, BGP-LS, PCEP and the like.

Similarly to the examples shown in FIG. 4 and FIG. 5, in FIG. 6 the routers 621, 622, 623, 624 may communicate with each other on IP/MPLS layer 620 using logical connectivity links, such as link 629, for example. In addition, OADM devices 661, 662, 663, 664, 665, 666 may communicate with each other on WDM layer 660 using has intra-optical layer connectivity links, such as link 671, for example. Link 671 and similar links may be a fiber span.

In an example, links, such as link 679, may be a separate collection of N carriers. For example, link 679 may be a collection of carriers $\lambda_{i=1 \ldots N}$. In comparison, link 671 may be a single carrier $\lambda_i$.

OADM devices 661, 662, 663, 664, 665, 666 may communicate with routers 621, 622, 623, 624 by way of cross-layer port-to-port connectivity using links 631, 632, 633, 634, respectively as shown in FIG. 6. Such port-to-port connectivity may use short or medium reach optical connections and may be similar to port-to-port connectivity shown in FIG. 4 and FIG. 5.

Through the example connectivity shown in FIG. 6, the SDN controller may communicate with the network to follow the procedures provided in FIG. 2 and FIG. 3. For example, the SDN controller may communicate with the network using the example connectivity shown in FIG. 6 to determine if the Tpp criterion is met and if the Tp criterion is met. Further, through the example connectivity shown in FIG. 6, the SDN controller may communicate with the network to follow the procedures provided in FIG. 11. For example, the SDN controller may communicate with the network using the example connectivity shown in FIG. 6 to determine if the Oc criterion is met and if the Ot criterion is met.

Figure 7:
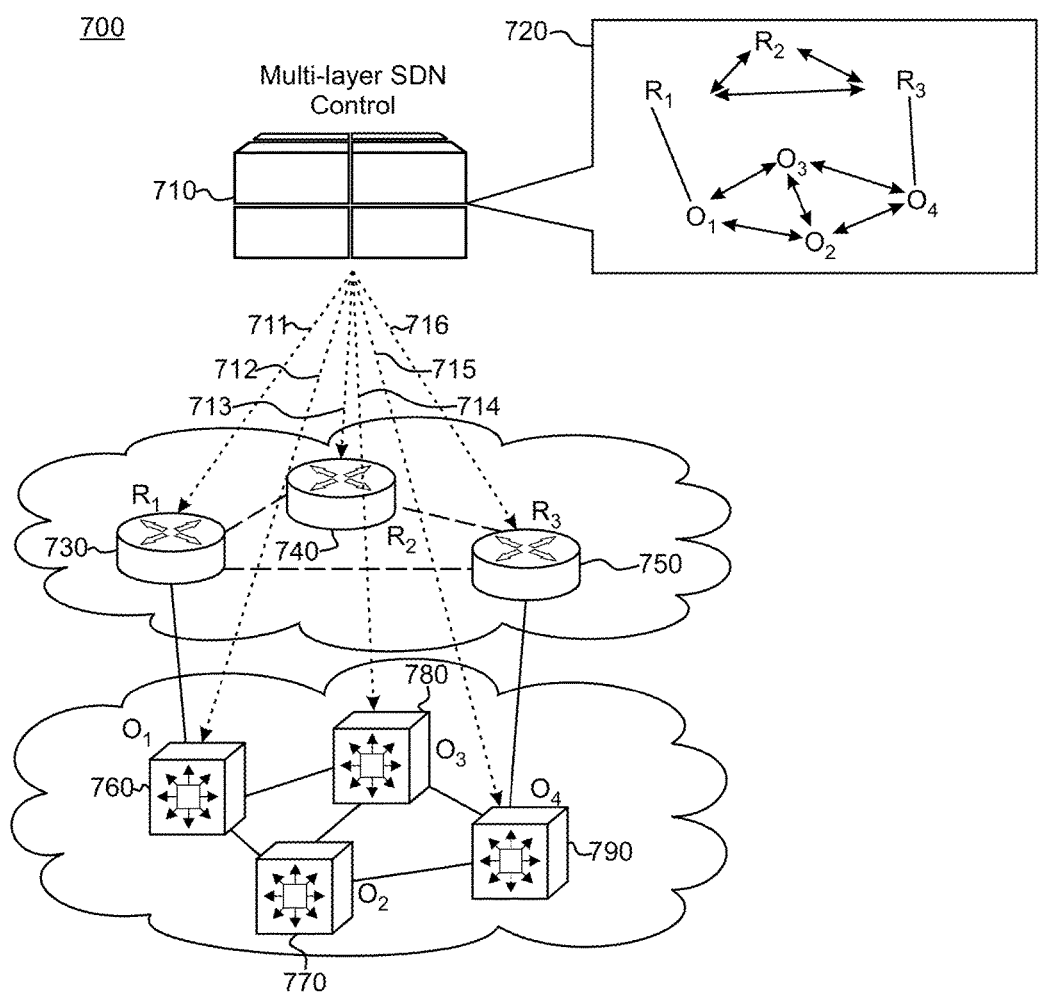
FIG. 7 is a network diagram illustrating an example of a centralized SDN controller providing proactive protection in a multi-fiber network across the IP/MPLS layer and the OTN layer.

FIG. 7 is a network diagram illustrating an example of a centralized SDN controller providing proactive protection in a multi-fiber network across the IP/MPLS layer and the OTN layer. As shown in diagram 700, the centralized SDN controller 710 may have management connectivity over a management network, such as a DCN, through communication channels with devices such as routers 730, 740, 750 on an IP/MPLS layer and such as with OTN network elements 760, 770, 780, 790 on an OTN layer. The management connectivity may use protocols such as OpenFlow, NETCONF, BGP-LS, PCEP and the like. In an example shown in FIG. 7, the centralized SDN controller 710 may communicate over communications channels 711, 713, 716 with routers 730, 740, 750, respectively. Further, the centralized SDN controller 710 may communicate over communications channels 712, 714, 715 with OTN network elements 760, 770, 780, 790, respectively.

In addition, routers 730, 740, 750 may communicate with each other on the IP/MPLS layer using intermediate system to intermediate system (IS-IS) protocol and label distribution protocol (LDP). Also, OTN network elements 760, 770, 780, 790 may communicate with each other on the OTN layer using GMPLS. In addition, routers 730, 740, 750 may communicate with OTN network elements 760, 770, 780, 790 by way of cross layer port-to-port connectivity. In an example shown in FIG. 7, router 730 may communicate with OTN network element 760 and router 750 may communicate with OTN network element 790 by way of cross layer port-to-port connectivity.

In an example shown in FIG. 7, the centralized SDN controller 710 may have full visibility of all of the devices in the network. For example, the centralized SDN controller 710 may have full visibility of the statuses and health indicators of the devices and statuses of the connections among the devices, for routers 730, 740, 750 and OTN network elements 760, 770, 780, 790. As shown in box 720, the centralized SDN controller 710 may have full visibility regarding the connections among the routers and OTN network elements of the network. Further, the centralized SDN controller 710 may determine that status of the connections among the devices and whether each connection is active or not. Further, routers 730, 740, 750 and OTN network elements 760, 770, 780, 790 may not run any control plane protocols and may have minimal peer discovery mechanisms.

Through the example connectivity shown in FIG. 7, the SDN controller may communicate with the network to follow the procedures provided in FIG. 2 and FIG. 3. For example, the SDN controller may communicate with the network using the example connectivity shown in FIG. 7 to determine if the Tpp criterion is met and if the Tp criterion is met. Further, through the example connectivity shown in FIG. 7, the SDN controller may communicate with the network to follow the procedures provided in FIG. 11. For example, the SDN controller may communicate with the network using the example connectivity shown in FIG. 7 to determine if the Oc criterion is met and if the Ot criterion is met.

Figure 8:
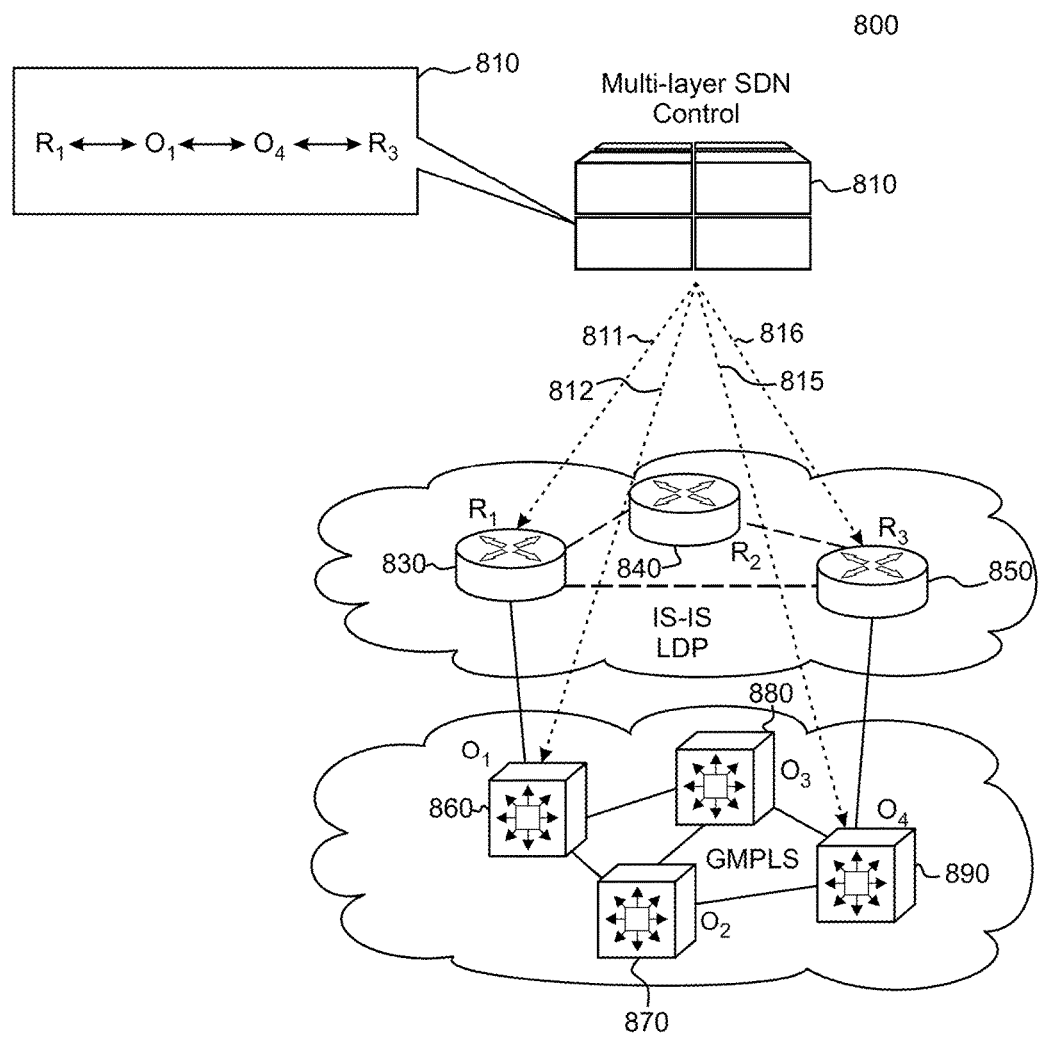
FIG. 8 is a network diagram illustrating an example of a hybrid SDN controller providing proactive protection in a multi-fiber network across the IP/MPLS layer and the OTN layer.

FIG. 8 is a network diagram illustrating an example of a hybrid SDN controller providing proactive protection in a multi-fiber network across the IP/MPLS layer and the OTN layer. As shown in diagram 800, the hybrid SDN controller 810 may have management connectivity over a management network, such as a DCN, through communication channels with devices such as routers 830, 850 on an IP/MPLS layer and such as with OTN network elements 860, 890 on an OTN layer. The management connectivity may use protocols such as OpenFlow, NETCONF, BGP-LS, PCEP and the like. In an example shown in FIG. 8, the hybrid SDN controller 810 may communicate over communications channels 811, 716 with routers 830, 850, respectively, and over communications channels 812, 815 with OTN network elements 860, 890, respectively.

In addition, routers 830, 840, 850 may communicate with each other on the IP/MPLS layer using intermediate system to intermediate system (IS-IS) protocol and label distribution protocol (LDP). Also, OTN network elements 860, 870, 880, 890 may communicate with each other on the OTN layer using GMPLS. In addition, routers 830, 840, 850 may communicate with OTN network elements 860, 870, 880, 890 by way of cross layer port-to-port connectivity. In an example shown in FIG. 8, router 830 may communicate with OTN network element 860 and router 850 may communicate with OTN network element 890 by way of cross layer port-to-port connectivity.

In an example shown in FIG. 8, the hybrid SDN controller 810 may have partial visibility of the devices in the network. For example, the hybrid SDN controller 810 may have partial visibility of the status of the devices and status of the connections among the devices. For example the hybrid SDN controller 810 may have visibility only of the edge nodes in the network, such as routers 830, 850 and OTN network elements 860, 890. As shown in box 820, the hybrid SDN controller 810 may have partial visibility regarding the connections among the routers and OTN network elements of the network. For example, the hybrid SDN controller 810 may have visibility of the edge nodes in the network, as shown in box 820. Further, the hybrid SDN controller 810 may determine that status of the connections among the edge nodes and whether each such connection is active or not. Further, routers 830, 840, 850 and OTN network elements 860, 870, 880, 890 may run routing and signaling protocols. Also, the hybrid SDN controller 810 may indicate the intent to re-route traffic to the edge nodes. The edge nodes may in turn invoke embedded control plane functions for service setup.

Through the example connectivity shown in FIG. 8, the SDN controller may communicate with the network to follow the procedures provided in FIG. 2 and FIG. 3. For example, the SDN controller may communicate with the network using the example connectivity shown in FIG. 7 to determine if the Tpp criterion is met and if the Tp criterion is met. Further, through the example connectivity shown in FIG. 8, the SDN controller may communicate with the network to follow the procedures provided in FIG. 11. For example, the SDN controller may communicate with the network using the example connectivity shown in FIG. 8 to determine if the Oc criterion is met and if the Ot criterion is met.

FIG. 9 is a network diagram illustrating an example of a multi-layer SDN controller providing proactive protection in a multi-fiber network, and the platforms and applications of the SDN controller. As shown in diagram 800, the multi-layer SDN controller 910 may have management connectivity over a management network, such as DCN 920, through communication channels with devices in a network, such as first network 930. The devices in the network may include a variety of devices, such as routers on an IP/MPLS layer, OTN network elements on an OTN layer, OADM devices on a WDM layer and optical muxponders on layer 0. Overall, the network may include one or more of layer 0, layer 1 and layer 3.

Further, the multi-layer SDN controller 910 may run controller applications 918 and functions on controller platform 912. The controller applications 918 and functions on controller platform 912 may run on physical servers or virtual machine based servers, and may use a network traffic engineering database 940 and a time series database 950. The network traffic engineering database 940 may house information concerning topology states of each layer and cross-layer connectivity, used and available bandwidth resources on links and shared risk groups (SRGs). An SRG may include a collection of entities, such as links, equipment, buildings, conduits, and the like, which indicate a shared fate. For example, failure of a particular SRG or member of the particular SRG may impact all other entities which use the particular SRG. the multi-layer SDN controller 910 may utilize the data in the network traffic engineering database 940 to compute end-to-end level 3 node to level 3 node paths. The time series database 950 may contain PM data from network devices such as packet layer statistics, OTN/WDM statistics, and the like. Packet layer statistics may include Octets, Packet, ErroredOctets, BadPackets, Jumbo Frames, and the like. OTN/WTM statistics may include pre-FEC-Q, pre-FEC-BER, PMD, CD, Output-Power, and the like. The PM data may be timestamped to allow the multi-layer SDN controller 910 to build a temporal profile of the collected data.

The controller applications 918 may include diagnostics applications, data analytics applications, multi-layer path computation element protocol (PCE) applications, proactive re-route engine applications and plug-in applications. The plug-in applications may use functions such as request functions, response functions, hypertext transport protocol secure (https) functions, RESTful functions and JavaScript object notation (JSON) functions. Further, the other applications in the controller applications 918 may use the plug-in application functions to draw on functions of the controller platform 912.

In addition, the controller platform 912 may include security functions, which may include Open Authorization (OAuth), secure sockets layer (SSL), and transport layer security (TLS) functions. Also, the controller platform 912 may include: adaptation functions, such as inventory functions, provisioning functions and monitoring functions; inventory functions, such as SubNetwork functions, Network Element (NE) functions and Port functions; and provisioning functions, such as LSP functions, SubNetwork Connection (SNC) functions and cross-connects (XCON) functions. Further, the controller platform 912 may provide notification functions as well as virtualization and overlay functions. Moreover, the controller platform 912 may provide port-monitoring functions, such as state monitoring, fault monitoring and configuration monitoring. In order to communicate with the first network 930 and possibly another network, such as a second network 913, the controller platform 912 may use a NE communication layer, which may use protocols such as OpenFlow, NETCONF, BGP-LS, PCEP and the like, as well as gRPCs and the like.

Figure 10:
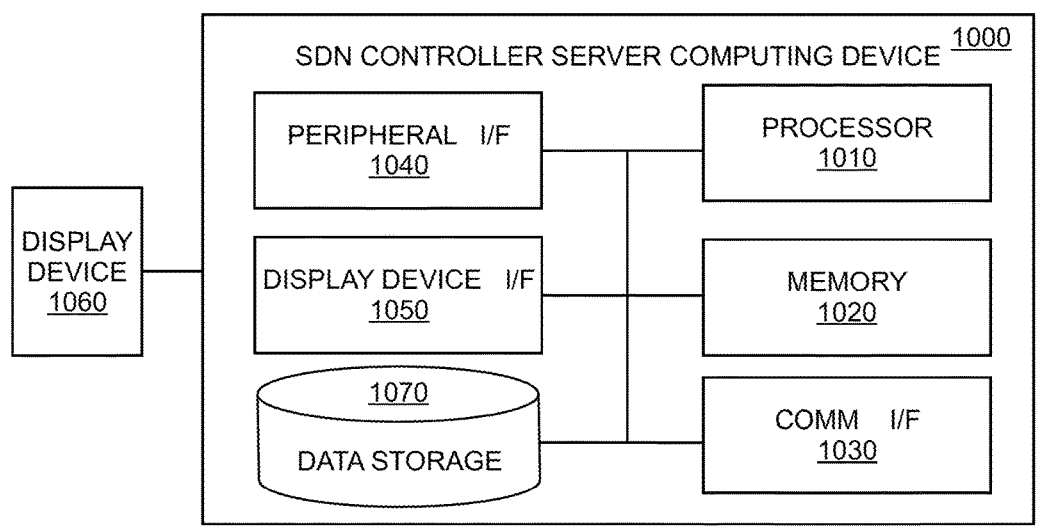
FIG. 10 is a diagram of an example SDN controller server computing device that may be used to implement one or more features described herein as performed by the SDN controller.

FIG. 10 is a diagram of an example SDN controller server computing device that may be used to implement one or more features described herein as performed by the SDN controller. The SDN controller server computing device 1000 may include a processor 1010, a memory device 1020, a communication interface 1030, a peripheral device interface 1040, a display device interface 1050, and a data storage device 1070. FIG. 10 also shows a display device 1060, which may be coupled to or included within the SDN controller server computing device 1000.

As used herein, the term "processor" refers to a device such as a single- or multi-core processor, a special purpose processor, a conventional processor, a Graphics Processing Unit (GPU), a digital signal processor, a plurality of microprocessors, one or more microprocessors in association with a DSP core, a controller, a microcontroller, one or more ASICs, one or more Field Programmable Gate Array (FPGA) circuits, any other type of integrated circuit (IC), a system-on-a-chip (SOC), a state machine, or a similar type of device. Processor 1010 may be or include any one or several of these devices.

The memory device 1020 may be or include a device such as a Random Access Memory (RAM), Dynamic RAM (D-RAM), Static RAM (S-RAM), other RAM or a flash memory. Further, memory device 1020 may be a device using a computer-readable medium. The data storage device 1070 may be or include a hard disk, a magneto-optical medium, a solid-state drive (SSD), an optical medium such as a compact disk (CD) read only memory (ROM) (CD-ROM), a digital versatile disk (DVDs), or Blu-Ray disc (BD), or other type of device for electronic data storage. Further, data storage device 1070 may be a device using a computer-readable medium. As used herein, the term "computer-readable medium" refers to a register, a cache memory, a ROM, a semiconductor memory device (such as a D-RAM, S-RAM, or other RAM), a magnetic medium such as a flash memory, a hard disk, a magneto-optical medium, an optical medium such as a CD-ROM, a DVDs, or BD, or other type of device for electronic data storage.

The communication interface 1030 may be, for example, a communications port, a wired transceiver, a wireless transceiver, and/or a network card. The communication interface 1030 may be capable of communicating using technologies such as SDN technology, wide area network (WAN) technology, SD-WAN technology, Ethernet, Gigabit Ethernet, fiber optics, microwave, xDSL (Digital Subscriber Line), Institute of Electrical and Electronics Engineers (IEEE) 802.11 technology, Wireless Local Area Network (WLAN) technology, wireless cellular technology, or any other appropriate technology.

The peripheral device interface 1040 is configured to communicate with one or more peripheral devices. The peripheral device interface 1040 operates using a technology such as Universal Serial Bus (USB), PS/2, Bluetooth, infrared, serial port, parallel port, FireWire and/or other appropriate technology. The peripheral device interface 1040 may, for example, receive input data from an input device such as a keyboard, a keypad, a mouse, a trackball, a touch screen, a touch pad, a stylus pad, a detector, a microphone, a biometric scanner, or other device. The peripheral device interface 1040 may provide the input data to the processor 1010. The peripheral device interface 1040 may also, for example, provide output data, received from the processor 1010, to output devices such as a speaker, a printer, a haptic feedback device, one or more lights, or other device. Further, an input driver may communicate with the processor 1010, peripheral device interface 1040 and the input devices, and permit the processor 1010 to receive input from the input devices. In addition, an output driver may communicate with the processor 1010, peripheral device interface 1040 and the output devices, and permit the processor 1010 to provide output to the output devices. One of ordinary skill in the art will understand that the input driver and the output driver may or may not be used, and that the SDN controller server computing device 1000 will operate in the same manner or similar manner if the input driver, the output driver or both are not present.

The display device interface 1050 may be an interface configured to communicate data to display device 1060. The display device 1060 may be, for example, a monitor or television display, a plasma display, a liquid crystal display (LCD), or a display based on a technology such as front or rear projection, light emitting diodes (LEDs), organic LEDs (OLEDs), or Digital Light Processing (DLP). The display device interface 1050 may operate using technology such as Video Graphics Array (VGA), Super VGA (S-VGA), Digital Visual Interface (DVI), High-Definition Multimedia Interface (HDMI), Super Extended Graphics Array (SXGA), Quad Extended Graphics Array (QXGA), or other appropriate technology. The display device interface 1050 may communicate display data from the processor 1010 to the display device 1060 for display by the display device 1060. Also, the display device may connect with speakers and may produce sounds based on data from the processor 1010. As shown in FIG. 10, the display device 1060 may be external to the SDN controller server computing device 1000, and coupled to the SDN controller server computing device 1000 via the display device interface 1050. Alternatively, the display device 1060 may be included in the SDN controller server computing device 1000. An instance of the SDN controller server computing device 1000 of FIG. 10 may be configured to perform any feature or any combination of features of the system and method described herein as performed by the SDN controller.

It should be understood that many variations are possible based on the examples described herein. Although features and elements are described above in particular combinations, each feature or element may be used alone without the other features and elements or in various combinations with or without other features and elements.

The methods provided may be implemented in a general-purpose computer, a processor, or a processor core. Suitable processors include, by way of example, a general-purpose processor, a special purpose processor, a conventional processor, a digital signal processor, a plurality of microprocessors, one or more microprocessors in association with a DSP core, a controller, a microcontroller, metal-oxide semiconductor field-effect transistors (MOSFETs), ASICs, FPGAs circuits, any other type of IC, and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor that implements aspects of the embodiments.

The suitable processors may include circuitry to implement the methods provided herein. The circuitry may include receiving circuitry, processing circuitry and transmitting circuitry.

The methods and flow charts provided herein may be implemented in a computer program, software, or firmware incorporated in a non-transitory computer-readable storage medium for execution by a general-purpose computer or a processor. Examples of non-transitory computer-readable storage media, include, but are not limited to, a ROM, a RAM, a register, cache memory, semiconductor memory devices, magnetic media such as internal hard disks and removable disks, magneto-optical media, and optical media such as CD-ROM disks, and digital versatile disks (DVDs).

Further, the devices according to various embodiments described herein may be interspersed among other devices depending on the functionality of the microelectronic device. In addition, the number and components of the devices may vary depending on the functionality of the microelectronic device. By way of example, the number of servers, which may be virtual servers, acting as the SDN controller may be one or may be several servers, such as tens of servers.

Network operators have long attempted to optimize the margin required on packet-optical transport networks using planning tools, some of which required exact planning to improve their accuracy. Such planning tools were employed before network capacity was established or deployed. In this way, network operators attempted to use optimization mechanisms on their networks before the actual performance of the network could be measured. After deployment, client data would then immediately be sent over the network, which had been through such optimization. However, the planning tools may result in imperfect optimization because real-world network conditions could vary from the planned network conditions.

As a result, a WDM transport system margin is typically used inefficiently. Given current demands on packet-optical transport networks, such an inefficient use of WDM system margin is no longer considered insignificant because WDM system designs have approached the Shannon-limit for optical fiber communication channels.

Therefore, a modified network technology, which more dynamically optimizes a transport system margin would improve network efficiency. Such an approach may include adopting flexible carrier capacity, which enables extensive margin optimization opportunities in several different use cases. For example, the flexible carrier capacity may include sub-50 gigabyte per second (Gb/s) resolution due to varying coherent modulation formats. Further, flexible carrier capacity may include probabilistic-constellation-shaping, as a next generation form of DSP.

The modified network technology may include a flex-grid WDM system spectrum. In an example, the modified network technology may include a Nyquist filtered super-channel.

Therefore, examples and embodiment described herein provide for improved margin optimization in optical transport networks through the measurement of pre-deployed carriers that are not yet used for client data. Pre-deployed optical devices, which may be PICs in an example, may measure the unused pre-deployed carriers to obtain real-time network information.

Also, the examples and embodiment described herein may be applicable for all client protocols. An example client protocol may include, a flex-Ethernet capacity on an IP/MPLS client may be used with the modified network technology.

Further, an SDN controller using global and statefull network information may apply network analytics and machine learning to the measurements, which may be used to operationalize the examples and embodiment described herein. The SDN controller may also enable a combination of planning and network variations, such time-of-day variations, by using an operational database.

Figure 11:
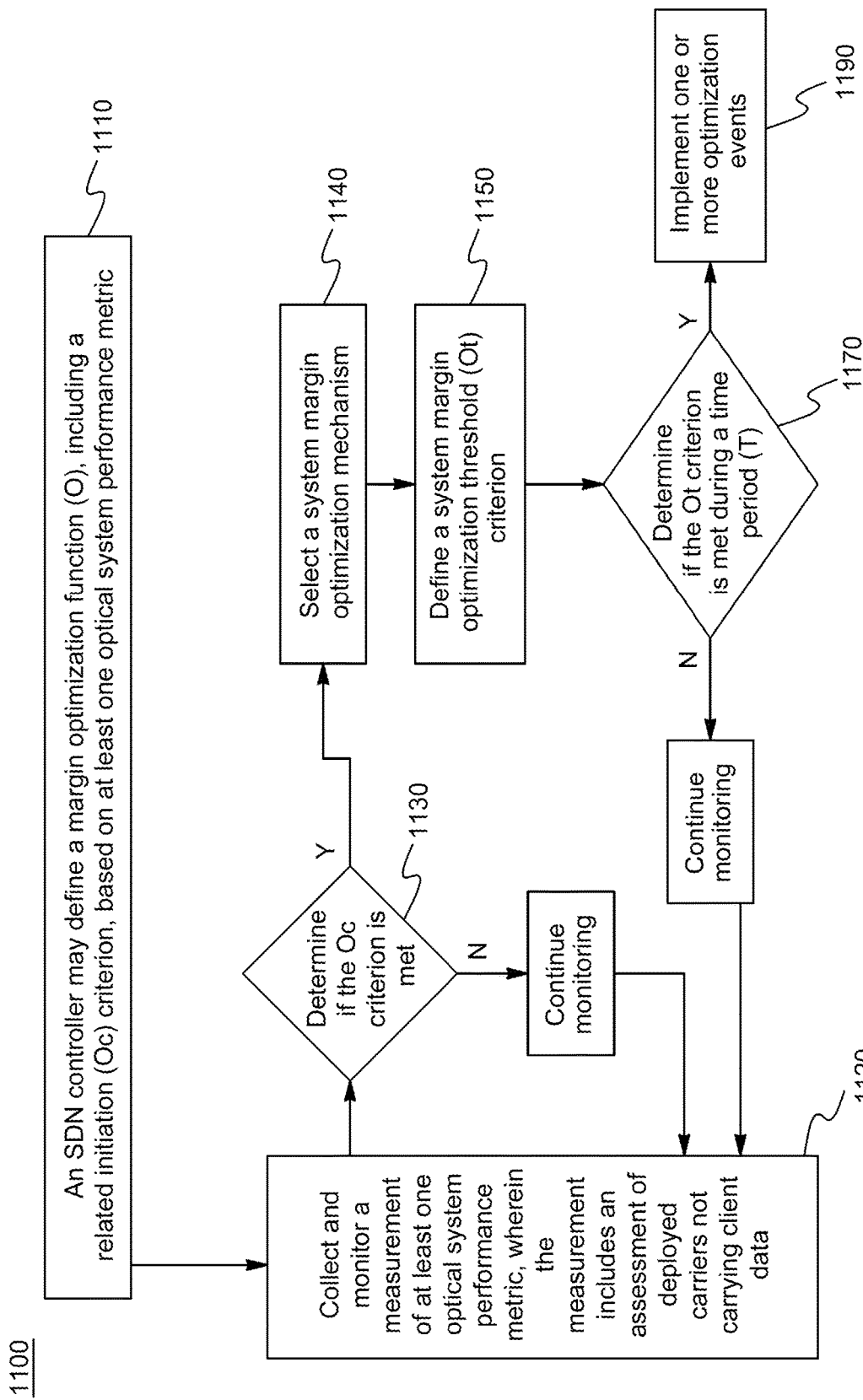
FIG. 11 is a flow chart illustrating an example of an SDN controller providing system margin optimization in an optical network.

FIG. 11 is a flow chart illustrating an example of an SDN controller providing system margin optimization in an optical network. As shown in an example in flow chart 1100, an SDN controller may define a margin optimization function (O), including a related initiation (Oc) criterion based on at least one optical system performance metrics, at step 1110. For example, the function (O) may also be based on a single optical system performance metric. In a further example, the function (O) may also be based on a plurality of optical system performance metrics. The SDN controller may then collect, monitor and store one or more measurements of at least one optical system performance metric, step 1120. The measurement may include an assessment of deployed carriers not carrying client data. In an example, a real-time monitoring protocol, such as a generic remote procedure call (gRPC), may periodically send or stream measured optical system performance metrics from an optical device in the network to the SDN controller. The optical device may be a PIC, in an example. In a further example, the PIC may use pre-deployed channels.

A wide variety of different metrics may be used as optical system performance metrics. For example, the optical system performance metric may be one of a Q-Factor metric, a transmission metric, a reception metric, a PIC metric, a DSP metric, a transponder metric, a power metric, a chromatic dispersion metric, a signal to noise ratio metric, a BER metric, a WDM metric, a crosstalk metric, an optical amplification gain level metric, an EDFA gain level metric, a Raman gain level metric, an optical fiber characteristic metric, an optical power monitor metric, an OTDR metric, an MPLS tunnel utilization metric, an OTN tunnel utilization metric, an LSP-RTD metric, a baud rate metric, a bit rate metric, a carrier capacity metric or a fiber capacity metric.

In an example, a PIC metric may measure one or more of the following: the number of optical carriers in the PIC and therefore in the transponder; the ability to tune the carriers to any wavelength in the C-band, L-band, and/or S-band, the ability to have different carrier spacing between the carriers; the ability to hold the carriers at their said frequency setting, so allowing for minimal drift of any one carrier relative to an absolute ITU frequency, or allowing for minimal drift between a group of carriers relative to their target spacing; the ability to hold the carriers at a desired or low laser linewidth; or the ability to impress a modulation on the carriers with minimal laser power loss. Further, in conjunction with the DSP, the PIC metric may measure one or more of the following: the ability to operate at a lower or higher baud rate; the ability to operate at different modulation formats, including hybrid modulation formats; or the ability to operate at different FEC overheads. Also, in conjunction with an amplifier inside or outside the transponder, the PIC metric may measure one or more of the following: the ability to operate at high per carrier powers as well as high aggregate powers; or the ability to operate at high and different launch OSNR settings.

In addition, actual fiber field data and actual device manufacturing data may be used as optical system performance metrics. In examples, actual fiber field data metrics may be obtained based on the actual use of deployed fiber in networks. Such actual fiber field data metrics may be in contrast to mere estimated metrics made during network planning, which are typically conservative. As a result of using actual fiber field data metrics, a network may obtain an OSNR benefit of the order of 1 dB. Such a benefit may usually be the same for all carriers in a WDM system network.

In additional examples, actual device manufacturing data may be used as optical system performance metrics, instead of merely relying upon the device specifications. Typically, device specifications are defined to hit yield targets, and as a result, when used in the planning tools, the device specifications may unnecessarily underestimate the performance of the actual module being installed in the network. Depending on the variance of the manufacturing distribution of each module, using actual device manufacturing data may allow at times for a system-level OSNR benefit of the order of 1 dB. Moreover, this benefit may usually be carrier specific, in contrast to the actual fiber field data metric benefits which may apply to all carriers in a network, as described herein above. Further, while the actual device manufacturing data benefit may often be captured though a closed-form analytic quantitative model, the more extensive the manufacturing distribution the more useful machine-learning may be.

In addition, the SDN controller may actively monitor the state of the optical network for optical system performance metrics. As described elsewhere herein, the SDN controller may configure the optical network devices to periodically stream the optical system performance metrics at regular intervals. The intervals may be expressed using any standardly used time measures. In an example, the intervals may be expressed as milliseconds. The optical system performance metrics may be streamed to the SDN controller.

Further, the optical system performance metrics may be archived in a time series database, allowing network analytics to be performed. The time series database may complement the SDN controller functionality. The database may be a database as shown in FIG. 4, FIG. 9 or both.

Also, the SDN controller may maintain one or more snapshots of instance when the system margin optimization algorithm is invoked. In an example, the SDN controller may maintain snapshots of all such instances. The instances may be annotated by timestamps, indexed by timestamps or both. This instances may be archived. The archived instances may provide historical information, which may be used by either the user or the system to infer statistics on the WDM margin process. The historical information may be used for analytics. In an example, the statistics may include how many times to optimization algorithm was run. In a further example, the system may be used the statistics as part of a machine-learning approach to re-train the system.

Further, the SDN controller may perform active profiling of the optical system performance metrics. For example, based on the archived optical system performance metrics, the SDN controller may build a correlation hysteresis to identify criterion matching events.

Accordingly, the SDN controller may apply network analytics to the stored and recently measured optical system performance metrics. Moreover, the SDN controller may use machine-learning techniques based on analytics of the optical system performance metrics.

Accordingly, while conducting continuous collection and monitoring, the SDN controller may determine if the defined Oc criterion is met 1130 based on at least one collected measurement. If the Oc criterion is met, the SDN controller may select a system margin optimization mechanism 1140. In an example, the system margin optimization mechanism may be pre-defined by a network operator. Also, the Oc criterion may be pre-defined by a network operator. In another example, the system margin optimization mechanism may be system-determined. For example, the SDN controller may use machine-learning techniques to determine and select the system margin optimization mechanism. Further, the system margin optimization mechanism may provide for the optimal margin allocation.

In an example, the system margin optimization mechanism may choose the best group of WDM carriers. In another example, the system margin optimization mechanism may add or subtract WDM carriers from the network while maintaining constant network capacity. In an additional example, the system margin optimization mechanism may add network capacity by adding WDM carriers. In a further example, the system margin optimization mechanism may use a router-to-optical protocol to adjust optical layer capacity. Further discussion of these examples is provided elsewhere herein.

In another example, the system margin optimization mechanism may not be pre-defined by the network operator. In addition, the Oc criterion may be pre-defined with a default criterion, such as a default event or condition. In an example, a default criterion may be a Q-Factor.

In addition, the SDN controller may define a system margin optimization threshold (Ot) criterion 1150. In an example, the Ot criterion may be pre-defined, or user-defined, by a network operator. In another example, the Ot criterion may be system-determined. For example, the SDN controller may use machine-learning techniques to determine and select the Ot criterion.

In examples, machine-learning techniques may enable an incremental, and therefore more realistic, utilization of the maximum combination of network benefits, such as the benefits described elsewhere herein in the examples regarding actual fiber field data and actual device manufacturing data. The network benefits may be based on good predictions of performance which in turn can be based on learning of the amount of margin needed during failure events, like fiber cuts. In an example, when fibers get cut, a mitigation goal may be to ensure that surviving channels are not impacted. Whether the surviving channels are impacted may depend on the number of amplifiers in the chain, the amount of transient (a ratio of surviving channels to total channels in dB), and the carrier wavelength assignment (a wavelength assignment of the surviving channels and channels lost by the cut). Such real-time evaluations may be best suited for machine-learning as these real-time evaluations may be not easily tractable analytically.

In addition, machine-learning may provide additional benefits from an aging margin analysis. Aging margin is usually not tractable analytically, given its dependence on many complex parameters. These parameters may include, for example, temperature, humidity and the like. As a result, again margin predictions without the use of machine-learning may often not be correct.

Also, machine-learning may also be sensitive to varying prediction horizons. For example, a first customer may have a five-year maximum prediction horizon while a second customer may have a 30 year prediction horizon. Machine-learning techniques may accommodate both such horizons and use collected system performance metrics to help optimize margin allocation.

Further, in examples, the Ot criterion may be the same as the Oc criterion or one of the Oc criteria. In an example, the Ot criterion may be more stringent than the Oc criterion. For example, an Ot criterion may be 0.5 dB better than an Oc criterion for an actual measured fiber link loss metric before Ot is met. In this way, the Ot criterion is more stringent than the Oc criterion The SDN controller may then determine if the Ot criterion is met 1170. If the Ot criterion is met, the SDN controller may implement one or more optimization events 1190. Further discussion of example optimization events is provided elsewhere herein.

If the Ot criterion is not met, the SDN controller may continue collecting and monitoring the one or more optical system performance metrics 1180. Further, while the SDN controller implements steps 1130 through 1180, it may continue to collect and monitor the one or more optical system performance metrics. In these ways, the SDN controller may collect and monitor optical system performance metrics continuously.

As mentioned elsewhere herein, SDN controller may then collect one or more measurements of the optical system performance metric or metrics from an optical device. The optical device may process information from one or more carriers. In an example, the optical device may be a PIC. In a further example, the optical device may include discrete optical components packaged into a physical module. The discrete optical components may be non-integrated in the physical module. In comparison, a PIC may include integrated components.

In an additional example, the physical packaging of the optical device and a DSP module can be encompassed within a single hardware enclosure. For example, the optical device and the DSP module may be within a single transponder, or a single line-card, such as a single printed circuit board (PCB).

Further, the optical device and the DSP module may be interconnected via standard computing peripheral interfaces. In another example, both the optical device and the DSP may be in separate, possibly individual, hardware modules connected via high-speed electrical or optical cables. For example, the optical device and the DSP module may be in separate hardware modules connected by way of an electrical interface, such as a backplane interface.

Figure 12A:
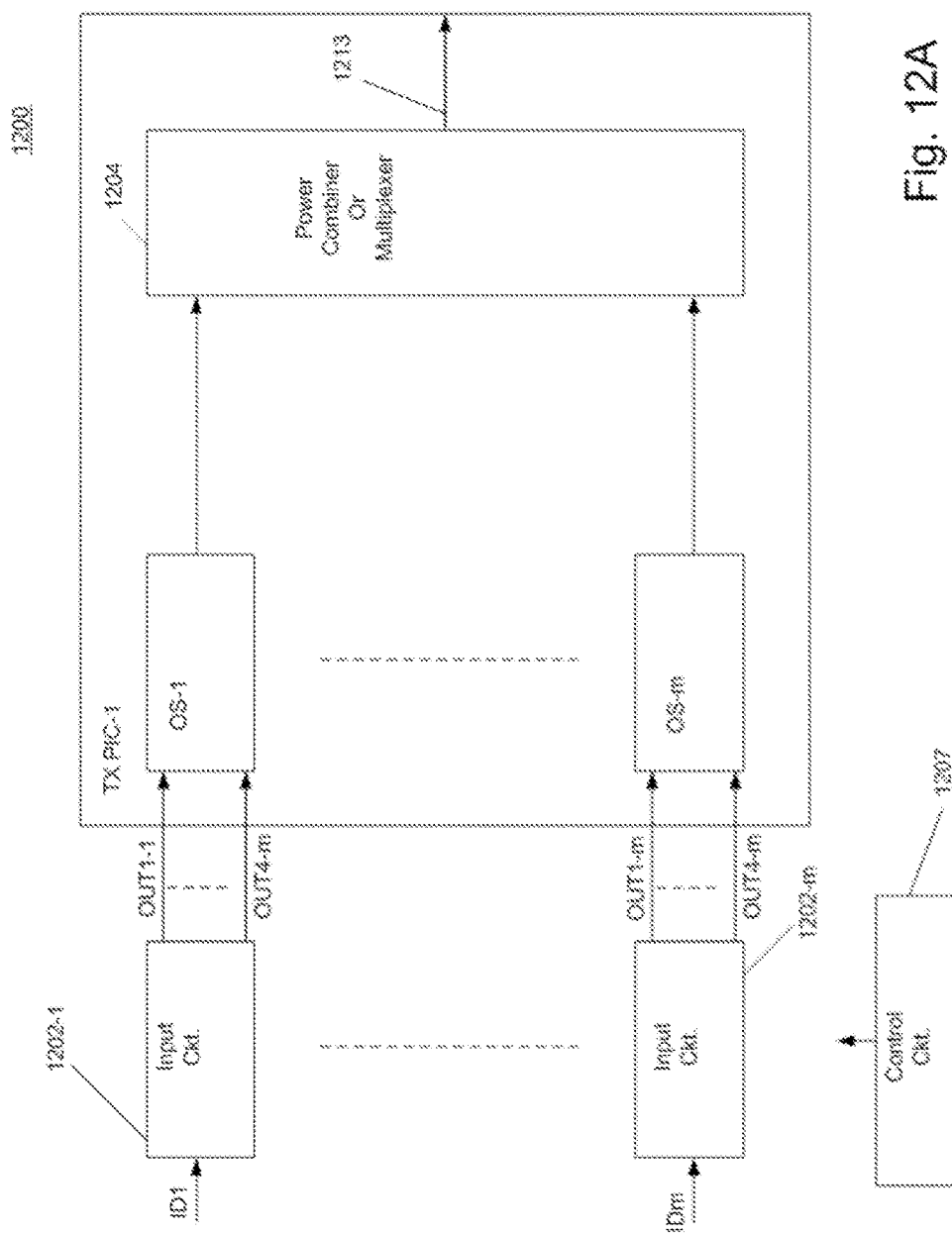
FIGS. 12A and 12B are diagrams of an example transponder including a transmitting photonic integrated circuit (PIC) and a receiving PIC.
Figure 12B:
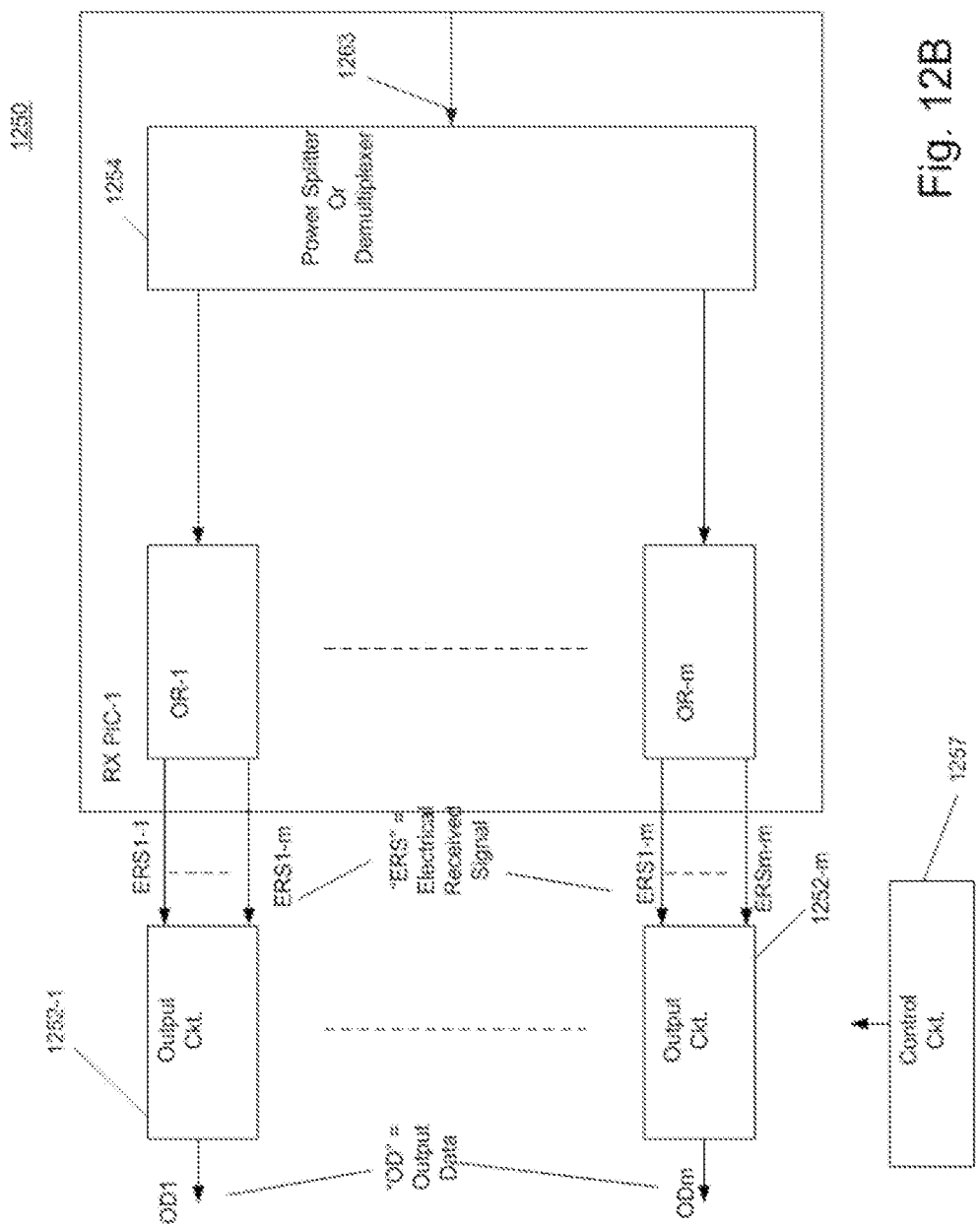

FIGS. 12A and 12B are diagrams of an example transponder including a transmitting PIC and a receiving PIC. As shown in an example in transponder 1200/1250, transmitting (TX) PIC-1 includes optical sources OS-1 to OS-m coupled to corresponding ones of input circuits 1202-1 to 1201-$m$, which may be included in a larger input block, in an example. Input circuits 1202-1 to 1202-$m$ may receive a corresponding one of input data streams ID1 to IDm, which are subject to known processing, such as FEC encoding among other processing, and output on one or more outputs (for example, outputs OUT1-1 to OUT4-1 of input circuit 1202-1 through outputs OUT1-$m$ to OUT4-$m$ of input circuit 1202-$m$) to a respective one of optical sources OS-1 to OS-m. Each of optical sources OS-1 to OS-m supplies a corresponding one of a plurality of modulated optical signal to a power combiner 1204. In an example, the power combiner 1204 may be a multiplexer. In a further example, the power combiner 1204 may be a known arrayed waveguide grating (AWG). The power combiner 1204, in turn, may be configured to multiplex or combine each of the plurality of optical signals onto output waveguide 1213. A control circuit 1207 may regulate the output of encoded data from input circuits 1202-1 to 1202-$m$. In an example, control circuit 1207 may be a DSP. Other PICs in the optical system may have the same or similar structure as TX PIC-1 and receiving (RX) PIC-1. A transponder 1200/1250 may include both TX PIC-1 and RX PIC-1. Further, in an example, a transceiver PIC may include both TX PIC-1 and RX PIC-1. In a further example, a transceiver PIC may be transponder 1200/1250.

Further, RX PIC-1 may include a power splitter or demultiplexer 1254 which may receive an input optical signal or input waveguide 1263. The power combiner 1254, in turn, may be configured to split or demultiplex optical signal 1263 into separate optical signals and supply them to optical receivers OR-1 to OR-m. Each of optical receivers OR-1 to OR-m may supply one or more signals to output circuits (for example, electrical received signals ERS1-1 to ERS1-$m$ of OR-1 supplied to output circuit 1252-1 through electrical received signals ERS1-$m$ to ERSm-m of OR-m supplied to output circuit 1252-$m$). Output circuits 1252-1 to 1251-$m$ may be included in a larger output block, in an example. Output circuits 1252-1 to 1252-$m$ may in turn output a corresponding one of output data streams OD1 to ODm. Further, output data streams OD1 to ODm may be subject to known processing. A control circuit 1257 may regulate the output of output data from output circuits 1252-1 to 1252-*m*. In an example, control circuit 1257 may be a DSP.

The transponder 1200/1250 may be considered to be a single transponder or may include two separate transponders, such as a transponder 1200 and a transponder 1250. Further, in an example one PIC may be a TX PIC-1 and another PIC may be an RX PIC-1. In another example, a single PIC may include both TX PIC-1 and RX PIC-1. In another example, one control circuit may be control circuit 1207 and another control circuit may be control circuit 1257. For example, one DSP may be control circuit 1207 and another DSP may be control circuit 1257. In another example, a single control circuit may be control circuit 1207 and control circuit 1257. For example, a single DSP may be control circuit 1207 and another DSP may be control circuit 1257.

The optical device described in examples herein may be included in a larger optical node physical structure. The node may be a transponder, in an example, such as transponder 1200/1250. In another example, the node may include a chassis based system, which has many transponders. The transponders may be inter-connected by way of one or more of a backplane, electrical cables or optical cables.

In an example, a PIC in examples herein may include a plurality of optical sources, such as OS-1 through OS-m, which may be integrated on a substrate. Each optical source may include a combination of a laser and one or more modulators for generating modulated optical signals including both transverse electric (TE) and transverse magnetic (TM) components. For example, TX PIC-1 may include OS-1 through OS-m, as seen above herein. The PIC also may have associated with it a plurality of DSP modules, such as a plurality of control circuit(s) 1207/1257. Further, a PIC may have a plurality of coherent optical receivers, for example, OR-1 through OR-m, such that each optical source or optical carrier in the PIC is associated with a unique optical receiver. Each optical source or optical carrier may be associated with a unique DSP module, or two optical carriers may share a DSP module. In example event that two optical carriers share a DSP module, they each may have a unique data path within the module.

Further examples of PICs, including TX PICs and RX PICs, are described in U.S. Patent Publication No. 2009/0245795, in U.S. patent application Ser. No. 12/572,179, U.S. Patent Publication No. 2011/0229149 and U.S. Patent Publication No. 2012/0082453, the contents of which are incorporated by reference as if fully set forth herein. A PIC may be a sub-system of a transponder and a DSP may be another sub-system of a transponder.

After an initial deployment of the system, relatively few optical sources may supply modulated optical signals carrying client data. The remaining, unused optical sources may be modulated to carry a test sequence or test pattern sequence. In examples, the test sequence may include random, pseudo-random, or deterministic bit sequences. For example, the test sequence may be a pseudo-random test sequence to measure one or more of BER, jitter, or wander. Test sequences specified by ITU-T 0.150 may be used in examples. The test sequence may have a $2^n-1$ bit(s) length. In an example, n may be the number of shift stages. In further examples, the test sequence may be a pseudo random binary sequence (PRBS), such as a PRBS-n pattern. A PRBS may be generated using a linear feedback shift register. Further, monic polynomials may be used to generate one or more PRBS(s). Example PRBS-n patterns include PRBS-7 ($x^7+x^6+1$), PRBS-9 ($x^9+x^5+1$), and PRBS-11 ($x^{11}+x^9+1$) through PRBS-31 ($x^{31}+x^{28}+1$). These test patterns may be those referenced in IEEE 802.3 standards or in OTN standards, such as ITU G.709. In addition, a test pattern sequence may include square waves.

In order to assess system margin for channels or signals at wavelengths to be added in response to future capacity requirements, the wavelengths of the unused modulated optical signals may be tuned to different wavelengths and performance metrics, such as BER, may be measured at those future or anticipated channel or carrier wavelengths. Multiple unused modulated optical signals may further be tuned so that the spectral spacing between such unused optical signals and their carrier capacities may be set to different values. Performance metrics may be obtained for each such value. Accordingly, performance metrics may be obtained for optical signals at particular wavelengths and over a variety of channel or carrier spacings over the C and/or L bands, for example, and/or other bands, such as the S band, even though such optical signals may not carry client data. Based on the measured performance metrics, system margin can be calculated, as discussed elsewhere herein.

In examples and embodiments herein, an SDN controller may assess system margins of deployed carriers. This may be done by way of a PIC generating an assessment of deployed carriers and sending this assessment to the SDN controller. For example, a PIC may receive a test sequence, for an optical system performance metric, over a set of deployed carriers. In an example, deployed carriers of the set are not carrying client data. The PIC may then compare the received test sequence against a known test sequence. Further, the PIC may generate an assessment of the deployed carriers not carrying client data based on the comparison of the received test sequence and the known test sequence. Then, the PIC may transmit a measurement of the optical system performance metric, which includes the assessment of deployed carriers not carrying client data.

In a further example, the PIC may transmit an optical signal carrying client data over another set of deployed carriers. Further assessments may be performed on the deployed carriers carrying client data. In another example, the test sequence may be at least one of a random bit sequence, a pseudo-random bit sequence or a deterministic bit sequence. The test sequence may be any one or a combination of the test sequences discussed elsewhere herein.

In examples and embodiments herein, the unused carriers of a PIC based optical network may be made to take multiple paths in the network between any source-destination pairs, and performance metrics such as BERs may be measured at those future or anticipated paths. Additionally, the unused PIC carriers may be tuned to different wavelengths as they traverse multiple paths. Based on the measured performance metrics, system margin may be calculated, as discussed elsewhere herein.

In examples and embodiments herein, an optimal system margin allocation may be improved by leveraging pre-deployed WDM carriers that are not used for client data. The pre-deployed WDM carriers that are not used for client data may be part of a high-end system optical performance monitoring (OPM) through the use of an optical device, such as a PIC. An SDN controller may use the OPM to proactively determine the optimal operation point for the network. This point may be determined before an actual operational event occurs. For example, this point may be determined before client data is sent over the unused carriers. In an example, this point may be determined at a predefined time after a bandwidth upgrade and before client data is transmitted over the upgraded bandwidth. In another example, this point may be determined during restoration events and may be determined in real time.

Through such OPM, the SDN controller may significantly improve system performance by optimizing optical system margin. In an example, optimizing optical system capacity may be achieved by minimizing the optical system margin.

As mentioned elsewhere herein, SDN controller may select and implement a system margin optimization mechanism. Further, the selected system margin optimization mechanism may address a time-varying system margin, which may typically include a deteriorating margin. In an example, the system margin optimization mechanism may choose the best group of WDM carriers while the capacity of the WDM carriers and the capacity of the system remain constant. The chosen group of WDM carriers may employ optimized FEC-gain sharing.

In an example, the group of WDM carriers may be a WDM channel pair. In another example, the group may include more than two channels, if a DSP/FEC engine of the network associated with the WDM carriers allows. Such a grouping would maximize the total FEC gains at a network level, based on network analytics information.

In an example, optimization consideration may include different FEC overheads, and other performance parameters. In a further example, FEC-gain sharing may be performed only at the WDM layer and happen only once based on a provisioning tool analysis. The analysis may be performed by a stateless SDN controller.

In another example, which may be more robust, the FEC-gain sharing WDM channel grouping can be dynamically changed over time by a re-allocation of the WDM channels that share FEC gains. Such an approach may be best possible based on a state-full SDN controller, or an advanced NMS.

In yet another example, which may be the most complex but potentially more power, the WDM group assignments may be guided by the SDN controller based on multilayer consideration such as quality of service (QoS).

In another example, the system margin optimization mechanism may add or subtract WDM carriers from the network but maintain constant optical network capacity by increasing or decreasing WDM system capacity per channel. An adaptation layer, such as an OTN layer, may accommodate such increase or decreasing of WDM system capacity per channel.

For example, the SDN controller may add WDM carriers to a network. The SDN controller may then adjust the spectral efficiency of one or more of the WDM carriers to accommodate variations of a WDM margin or system margin without compromising the optical capacity in systems with OTN, or some other client-layer adaptation mechanisms. Accordingly, the SDN controller may then reduce the spectral efficiency of one or more of the WDM carriers and keep the optical network capacity constant. In another example, the SDN controller may subtract WDM carriers from a network. As a result, the SDN controller may then improve the spectral efficiency of one or more of the WDM carriers and keep the optical network capacity constant.

Such a constant network capacity approach may be particularly applicable for pre-deployed WDM capacity, notably in PIC-based WDM systems. Such pre-deployed WDM capacity may include carriers that have been deployed but are not yet carrying client data.

In an example, at a Beginning-of-Life (BoL), an SDN controller may operate each carrier at higher spectral efficiency modulation, for example, 16-quadrature amplitude modulation (QAM). Further, when margin deteriorates, for due to End-of-Life (EoL) degradation or an optical restoration event, the SDN controller may switch an applicable carrier modulation to a lower spectral efficiency, for example, 8-QAM. The SDN controller may then serve the missed capacity through spare, previously unused WDM carriers.

In a further example, the system margin optimization mechanism may use a router-to-optical protocol to adjust optical layer capacity, which may result in reduced or increased optical channel and WDM system capacity. Such an approach may be taken when the addition or subtraction of WDM carriers is not possible. The protocol may be flex-Ethernet, in an example.

In an example, an SDN controller may adjust a spectral efficiency of a network to accommodate variations of a WDM margin by reducing the optical capacity of the WDM carriers, and leveraging a protocol like Flex-E to accommodate at the routing layer the capacity adjustments. For example, at BoL, the SDN controller may operate each carrier at a higher spectral efficiency modulation, for example, 32-QAM. If margin deteriorates, for example, due to EoL degradation, the SDN controller may switch a carrier's modulation to a lower spectral efficiency, for example, 16-QAM. The SDN controller may serve the missed capacity through spare, previously unused WDM carriers. Such an approach may be particularly applicable for alien-wave and/or data center interconnect (DCI) implementations.

In further embodiments and example, two separate mechanisms described above herein may be combined to produce resulting synergistic benefits. A first mechanism may describe the embodiments for WDM margin optimization, such as the examples described in FIG. 11 and related text. A second mechanism may describe the embodiments for proactive multilayer transport SDN protection, such as the examples described in FIGS. 1-3 and related text. The first mechanism may be used in combination with the second mechanism. Combining the two example mechanisms may allow for synergies that significantly improve network operation, allowing for combined benefits of both mechanisms.

In one example, a network operator that wishes to maximize the benefit of proactive multilayer transport SDN protection as described in the second mechanism may chose also to proactively adjust the WDM system margin optimization based on the framework described in the first mechanism. This proactively optimized adjustment of WDM system margin may become one of the proactive protection events initiated in step 160 of FIG. 1. Also, in the same or a different example, a network operator may proactively adjust the WDM system margin using the optimization example in FIG. 11, as one of the proactive protection events implemented in step 190 of FIG. 1.

Similarly, in the same or a different example, a proactive protection event initiated in step 160 of FIG. 1, may become input to the definition of Oc as described in step 1110 of FIG. 11, or the definition of Ot as described in step 1150 of FIG. 11. Also, a proactive protection event implemented in step 190 of FIG. 1, may become input to the definition of Oc as described in step 1110 of FIG. 11, or the definition of Ot as described in step 1150 of FIG. 11.

In such examples of combined use, the SDN controller, the network analytics, and the machine-learning frameworks employed in the two mechanisms may be the same. Further benefits may be realized as the mechanisms are run repeatedly over time and as they obtain increased network knowledge.

What is claimed is:

1. A method, in a software defined network (SDN) controller, of optimizing optical transport the method comprising:
defining, by the SDN controller, a margin optimization function based on at least one optical system performance metric, wherein the margin optimization function includes at least one related initiation criterion;
collecting, by the SDN controller, at least one measurement for the at least one optical system performance metric, wherein the measurement includes an assessment of deployed carriers not carrying client data;
determining, by the SDN controller, whether the initiation criterion is met based on the at least one collected measurement;
selecting, by the SDN controller, a system margin optimization mechanism and defining a system margin optimization threshold criterion on a condition that the initiation criterion is met;
determining, by the SDN controller, whether the system margin optimization threshold criterion is met; and
implementing, by the SDN controller, one or more optimization events on a condition that the system margin optimization threshold criterion is met,
wherein the one or more optimization events includes controlling a plurality of optical sources in a transponder to transmit additional wavelength division multiplexed (WDM) carriers based on an output of the SDN controller.

2. The method of claim 1, wherein one or more optimization events are implemented on a condition that the system margin optimization threshold criterion is met within a time period.

3. The method of claim 1, wherein at least one of the optimization events includes minimizing an available optical system margin.

4. The method of claim 1, further comprising:
further collecting, by the SDN controller, at least one measurement for an optical system performance metric on a condition that the system margin optimization threshold criterion is not met within a time period.

5. The method of claim 1, wherein the system margin optimization mechanism further includes optimizing forward error correction (FEC)-gain sharing by choosing a grouping of the WDM carriers.

6. The method of claim 1, wherein the the additional WDM carriers are transmitted while maintaining constant network capacity.

7. The method of claim 1, wherein the additional WDM carriers provide additional network capacity.

8. The method of claim 1, wherein the optical system performance metric is one of a Q-Factor metric, a transmission metric, a reception metric, a photonic integrated circuit (PIC) metric, a digital signal processing (DSP) metric, a transponder metric, a power metric, a chromatic dispersion metric, a signal to noise ratio metric, a bit error rate (BER) metric, a wavelength division multiplexing (WDM) metric, a crosstalk metric, an optical amplification gain level metric, an erbium doped fiber amplifier (EDFA) a gain level metric, a Raman gain level metric, an optical fiber characteristic metric, an optical power monitor metric, an optical time domain reflectometry (OTDR) metric, a multi-protocol label switching (MPLS) tunnel utilization metric, an optical transport network (OTN) tunnel utilization metric, a label switched path (LSP)-round-trip delay (RTD) metric, a baud rate metric, a bit rate metric, a carrier capacity metric or a fiber capacity metric.

9. A software defined network (SDN) controller for optimizing optical transport, the SDN controller comprising:
a transponder including a plurality of optical sources;
a processor configured to define a margin optimization function based on at least one optical system performance metric, wherein the margin optimization function includes at least one related initiation criterion;
a communication interface operatively coupled to the processor, the communication interface and the processor configured to collect at least one measurement for the at least one optical system performance metric, wherein the measurement includes an assessment of deployed carriers not carrying client data;
the processor configured to determine whether the initiation criterion is met based on the at least one collected measurement;
the processor configured to select a system margin optimization mechanism and define a system margin optimization threshold criterion on a condition that the initiation criterion is met;
the processor configured to determine whether the system margin optimization threshold criterion is met;
the communication interface and the processor configured to implement one or more optimization events on a condition that the system margin optimization threshold criterion is met, and
the one or more optimization events includes controlling the plurality of optical sources in the transponder to transmit additional wavelength division multiplexed (WDM) carriers based on an output of the SDN controller.

10. The SDN controller of claim 9, wherein one or more optimization events are implemented on a condition that the system margin optimization threshold criterion is met within a time period.

11. The SDN controller of claim 9, wherein at least one of the optimization events includes minimizing an available optical system margin.

12. The SDN controller of claim 9, further comprising:
the communication interface and the processor configured to further collect at least one measurement for an optical system performance metric on a condition that the system margin optimization threshold criterion is not met within a time period.

13. The SDN controller of claim 9, wherein the system margin optimization mechanism further includes optimizing forward error correction (FEC)-gain sharing by choosing a grouping of the WDM carriers.

14. The SDN controller of claim 9, wherein the additional WDM carriers are transmitted while maintaining constant network capacity.

15. The SDN controller of claim 9, wherein the the additional WDM carriers provide additional network capacity.

16. The SDN controller of claim 9, wherein the optical system performance metric is one of a Q-Factor metric, a transmission metric, a reception metric, a photonic integrated circuit (PIC) metric, a digital signal processing (DSP) metric, a transponder metric, a power metric, a chromatic dispersion metric, a signal to noise ratio metric, a bit error rate (BER) metric, a wavelength division multiplexing (WDM) metric, a crosstalk metric, an optical amplification gain level metric, an erbium doped fiber amplifier (EDFA) a gain level metric, a Raman gain level metric, an optical fiber characteristic metric, an optical power monitor metric, an optical time domain reflectometry (OTDR) metric, a multi-protocol label switching (MPLS) tunnel utilization metric, an optical transport network (OTN) tunnel utilization metric, a label switched path (LSP)-round-trip delay (RTD) metric, a baud rate metric, a bit rate metric, a carrier capacity metric or a fiber capacity metric.

* * * * *